US012647096B2

(12) United States Patent
    Daimon

(10) Patent No.: US 12,647,096 B2
(45) Date of Patent: Jun. 2, 2026

(54) ACOUSTIC WAVE DEVICE

(71) Applicant: Murata Manufacturing Co., Ltd.,
                Nagaokakyo (JP)

(72) Inventor: Katsuya Daimon, Nagaokakyo (JP)

(73) Assignee: **MURATA MANUFACTURING CO.,
                LTD.,** Kyoto (JP)

( * ) Notice: Subject to any disclaimer, the term of this
              patent is extended or adjusted under 35
              U.S.C. 154(b) by 86 days.

(21) Appl. No.: 18/657,884

(22) Filed: May 8, 2024

(65) Prior Publication Data

US 2024/0297634 A1     Sep. 5, 2024

Related U.S. Application Data

(63) Continuation of application No.
     PCT/JP2022/041862, filed on Nov. 10, 2022.
     (Continued)

(51) Int. Cl.
     *H03H 9/145*      (2006.01)
     *H03H 9/02*       (2006.01)
     *H03H 9/54*       (2006.01)
(52) U.S. Cl.
     CPC .... *H03H 9/14517* (2013.01); *H03H 9/02015*
            (2013.01); *H03H 9/02992* (2013.01); *H03H
                                            9/54* (2013.01)
(58) Field of Classification Search
     CPC .............. H03H 9/02559; H03H 9/145; H03H
                    9/14517; H03H 9/64; H03H 9/25;
     (Continued)

(56) References Cited

U.S. PATENT DOCUMENTS 10,491,192 B1    11/2019  Plesski et al.
  2011/0068655 A1     3/2011  Solal et al.
                    (Continued)

FOREIGN PATENT DOCUMENTS

JP        2012186808 A      9/2012
JP        2013518455 A      5/2013
                    (Continued)

OTHER PUBLICATIONS

International Search Report in PCT/JP2022/041862, mailed Jan. 31,
2023, 3 pages.
                    (Continued)

*Primary Examiner* — Quan Tra
(74) *Attorney, Agent, or Firm* — Keating & Bennett, LLP

(57)                ABSTRACT

An acoustic wave device includes a support including a
support substrate, a piezoelectric layer on the support, and
an IDT electrode including busbars and electrode fingers,
and a mass-adding film on the piezoelectric layer. In plan
view as seen in a stacking direction in which the support and
the piezoelectric layer are stacked, an acoustic reflector
overlaps at least a portion of the IDT electrode. d/p is less
than or equal to about 0.5, where d is a thickness of the
piezoelectric layer and p is a center-to-center distance
between adjacent electrode fingers. A region in which adja-
cent electrode fingers overlap each other when seen from an
electrode-finger-facing direction is a crossing region.
Regions between the crossing region and the pair of busbars
include first and second gap regions. The mass-adding film
overlaps the gap region in plan view and is on the second
main surface of the piezoelectric layer.

24 Claims, 19 Drawing Sheets

Related U.S. Application Data

(60) Provisional application No. 63/278,622, filed on Nov. 12, 2021.

(58) Field of Classification Search
CPC .. H03H 9/02015; H03H 9/02992; H03H 9/54; H03H 9/02574; H03H 9/02228
See application file for complete search history.

(56) References Cited

U.S. PATENT DOCUMENTS

| | | | |
|---|---|---|---|
| 2013/0051588 A1 | 2/2013 | Ruile et al. | |
| 2017/0155373 A1* | 6/2017 | Ruby ................. | H03H 9/02574 |
| 2019/0074813 A1* | 3/2019 | Zou ........................ | H03H 9/562 |
| 2020/0162052 A1* | 5/2020 | Matsuoka ................ | H03H 3/08 |
| 2020/0328727 A1 | 10/2020 | Daimon | |
| 2022/0216842 A1 | 7/2022 | Nagatomo et al. | |
| 2022/0321096 A1* | 10/2022 | Goto ................. | H03H 9/02866 |

FOREIGN PATENT DOCUMENTS

| | | | | |
|---|---|---|---|---|
| WO | 2019139076 A1 | 7/2019 | | |
| WO | WO-2020184466 A1 * | 9/2020 | ......... | H03H 9/02574 |
| WO | 2021060523 A1 | 4/2021 | | |

OTHER PUBLICATIONS

Written Opinion in PCT/JP2022/041862, mailed Jan. 31, 2023, 4 pages.

\* cited by examiner

FIG. 23
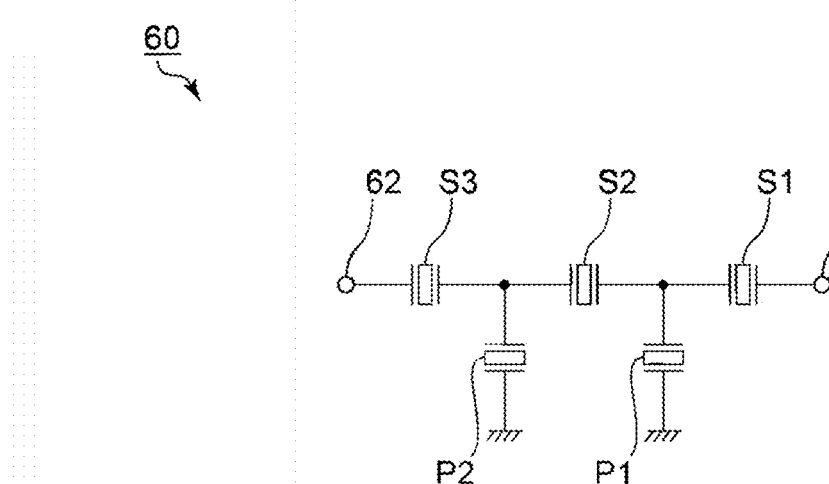
FIG. 24A                                     FIG. 24B
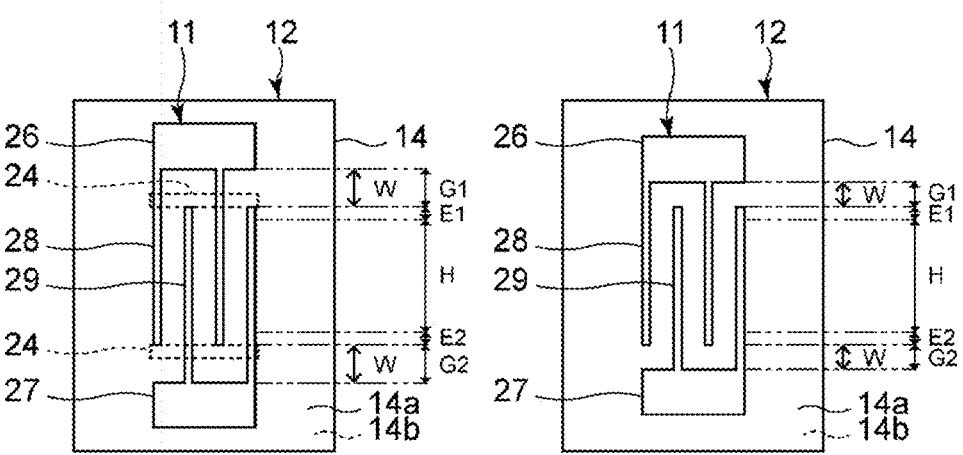

FIG. 25A                                              FIG. 25B
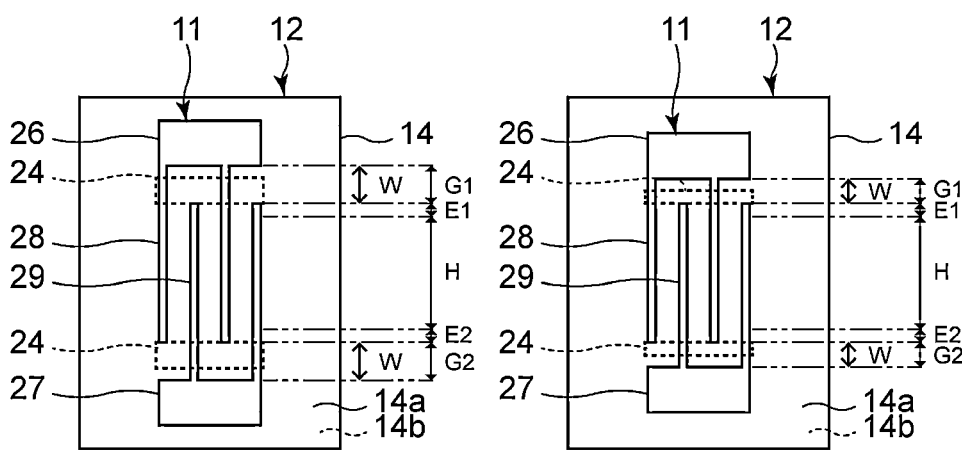

ACOUSTIC WAVE
PROPAGATION
DIRECTION
(THICKNESS
DIRECTION)

PARTICLE DISPLACEMENT
DIRECTION

ACOUSTIC WAVE DEVICE

CROSS REFERENCE TO RELATED APPLICATIONS

This application claims the benefit of priority to Provisional Application No. 63/278,622 filed on Nov. 12, 2021 and is a Continuation Application of PCT Application No. PCT/JP2022/041862 filed on Nov. 10, 2022. The entire contents of each application are hereby incorporated herein by reference.

BACKGROUND OF THE INVENTION

1. Field of the Invention

The present invention relates to acoustic wave devices.

2. Description of the Related Art

To date, acoustic wave devices have been widely used for filters of mobile phones and the like. In recent years, an acoustic wave device that uses a thickness-shear-mode bulk wave, such as the one described in U.S. Pat. No. 10,491,192, has been proposed. In the acoustic wave device, a piezoelectric layer is provided on a support. A pair of electrodes are provided on the piezoelectric layer. The pair of electrodes face each other on the piezoelectric layer and are connected to potentials that differ from each other. A thickness-shear-mode bulk wave is excited by applying an alternate-current voltage between the electrodes.

In Japanese Unexamined Patent Application Publication No. 2012-186808, an example of an acoustic wave device that uses a piston mode is disclosed. In the acoustic wave device, an IDT (interdigital transducer) electrode is provided on a piezoelectric substrate. The IDT electrode has a central region and a pair of edge regions. The pair of edge regions face each other with the central region therebetween in a direction in which a plurality of electrode fingers extend. In the pair of edge regions, a dielectric layer and the like are provided on the IDT electrode. Thus, a piston mode is established by configuring a plurality of regions, having different acoustic velocities, in the direction in which the plurality of electrode fingers extend. By doing so, suppression of a transverse mode is intended.

SUMMARY OF THE INVENTION

The inventors have discovered use of a piston mode in an acoustic wave device that uses a thickness-shear-mode bulk wave. Moreover, the inventors have discovered that, even if a dielectric layer is provided on an IDT electrode in a pair of edge regions, it is difficult to achieve both of suppression of unnecessary waves that are generated in a band between a resonant frequency and an anti-resonant frequency, and sufficient reduction of insertion loss.

Example embodiments of the present invention provide acoustic wave devices that reduce or prevent unnecessary waves and can reduce or prevent insertion loss in a band between a resonant frequency and an anti-resonant frequency.

An acoustic wave device according to an example embodiment of the present invention includes a support including a support substrate, a piezoelectric layer that is provided on the support, is made of lithium niobate or lithium tantalate, and includes a first main surface and a second main surface that face each other, an IDT electrode that is provided on the first main surface of the piezoelectric layer and includes a pair of busbars and a plurality of electrode fingers, and at least one mass-adding film that is provided on the piezoelectric layer. In plan view as seen in a stacking direction in which the support and the piezoelectric layer are stacked, an acoustic reflector is provided at a position that overlaps at least a portion of the IDT electrode. d/p is less than or equal to about 0.5, where d is a thickness of the piezoelectric layer and p is a center-to-center distance between the electrode fingers that are adjacent to each other. Some electric fingers among the plurality of electrode fingers are connected to one of the busbars of the IDT electrode, remaining electrode fingers among the plurality of electrode fingers are connected to the other busbar, and the plurality of electrode fingers that are connected to the one of the busbars and the plurality of electrode fingers that are connected to the other busbar interdigitate with each other. When an electrode-finger-facing direction is defined as a direction in which the electrode fingers that are adjacent to each other face each other, a region in which the adjacent electrode fingers overlap each other when seen from the electrode-finger-facing direction is a crossing region, and regions that are located between the crossing region and the pair of busbars are a pair of gap regions. At least one of the mass-adding film overlaps the gap region in plan view and is provided on the second main surface of the piezoelectric layer.

With example embodiments of the present invention, it is possible to provide acoustic wave devices that each reduce or prevent unnecessary waves and reduce or prevent insertion loss in a band between a resonant frequency and an anti-resonant frequency.

The and above other elements, features, steps, characteristics and advantages of the present invention will become more apparent from the following detailed description of the example embodiments with reference to the attached drawings.

BRIEF DESCRIPTION OF THE DRAWINGS

FIG. 1 is a schematic plan view of an acoustic wave device according to a first example embodiment of the present invention.

FIG. 2 is a schematic cross-sectional view taken along line I-I in FIG. 1.

FIG. 23 is a circuit diagram of a filter device according to a fifth example embodiment of the present invention.

FIG. 24A is a schematic plan view of a parallel arm resonator in the fifth example embodiment of the present invention.

FIG. 24B is a schematic plan view of a serial arm resonator in the fifth example embodiment of the present invention.

FIG. 25A is a schematic plan view of a first acoustic wave resonator in a sixth example embodiment of the present invention. FIG. 25B is a schematic plan view of a second acoustic wave resonator in the sixth example embodiment of the present invention.

DETAILED DESCRIPTION OF THE EXAMPLE EMBODIMENTS

Figure 3:
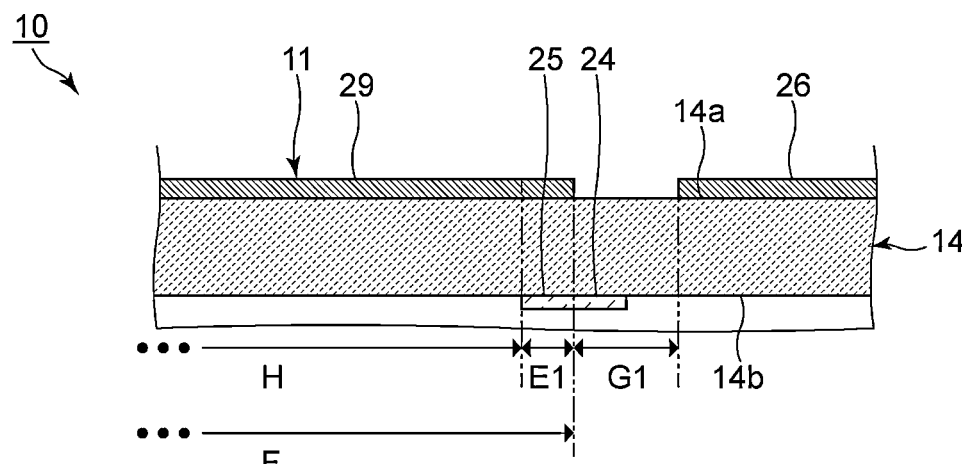
FIG. 3 is a schematic cross-sectional view taken along line II-II in FIG. 1, illustrating the vicinity of a first gap region.

Hereafter, the present invention will be clarified by describing example embodiments of the present invention with reference to the drawings.

Note that each example embodiment described in the present description is an example and it is possible to partially replace or combine configurations between different example embodiments.

Figures 1, 2:
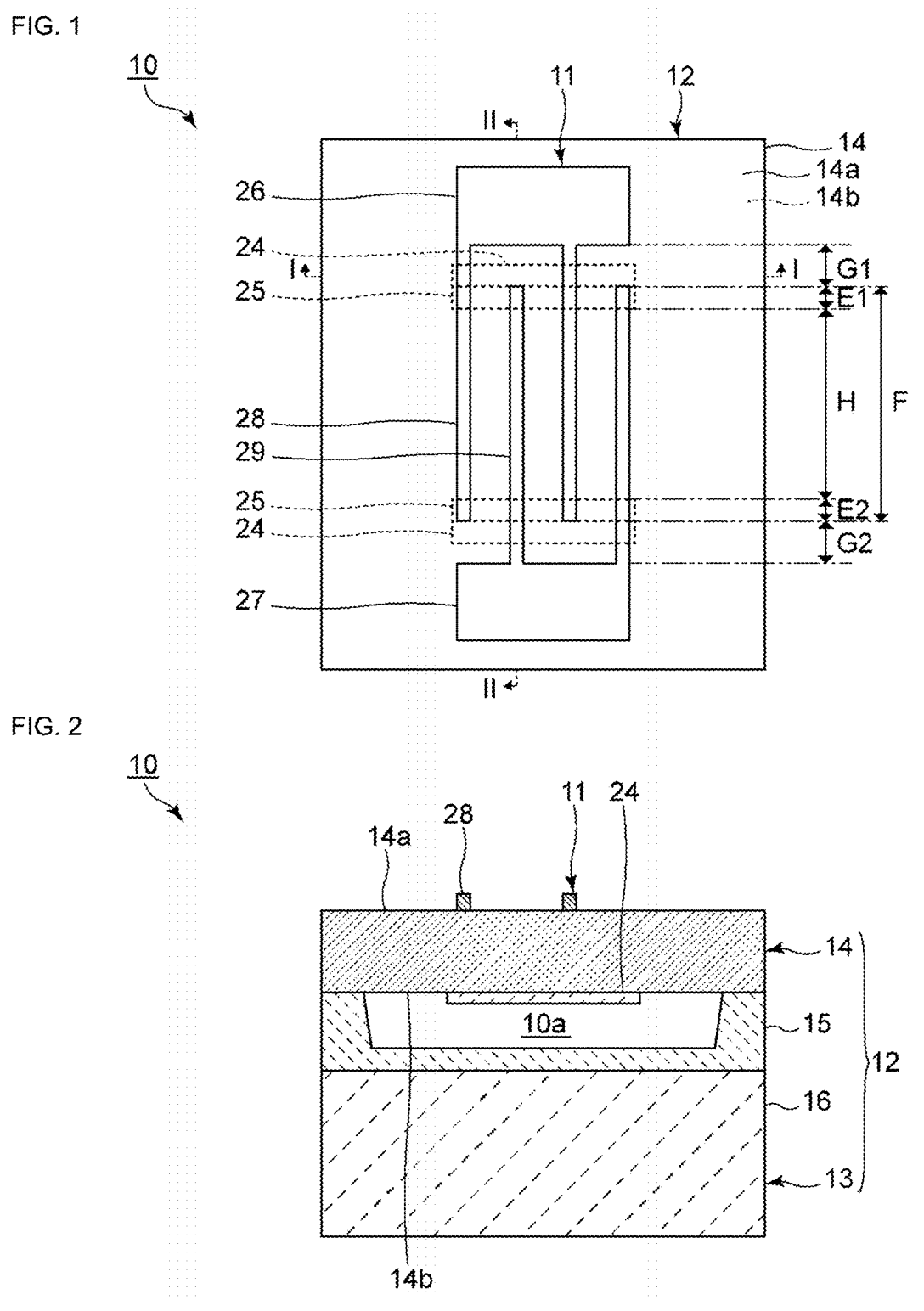

FIG. 1 is a schematic plan view of an acoustic wave device according to a first example embodiment of the present invention. FIG. 2 is a schematic cross-sectional view taken along line I-I in FIG. 1.

As illustrated in FIG. 1, an acoustic wave device 10 includes a piezoelectric substrate 12 and an IDT electrode 11. As illustrated in FIG. 2, the piezoelectric substrate 12 includes a support 13 and a piezoelectric layer 14. In the present example embodiment, the support 13 includes a support substrate 16 and an insulating layer 15. The insulating layer 15 is provided on the support substrate 16. The piezoelectric layer 14 is provided on the insulating layer 15. However, the support 13 may include only the support substrate 16.

The piezoelectric layer 14 has a first main surface 14a and a second main surface 14b. The first main surface 14a and the second main surface 14b face each other. The second main surface 14b, between the first main surface 14a and the second main surface 14b, is located on the support 13 side.

As the material of the support substrate 16, for example, it is possible to use a semiconductor such as silicon, ceramics such as aluminum oxide, or the like. As the material of the insulating layer 15, it is possible to use any appropriate dielectric such as silicon oxide or tantalum oxide. The piezoelectric layer 14 is, for example, a lithium niobate layer such as a $LiNbO_3$ layer or a lithium tantalate layer such as a $LiTaO_3$ layer. The piezoelectric layer 14 has an X axis, a Y axis, and a Z axis as crystal axes.

As illustrated in FIG. 2, a recessed portion is provided in the insulating layer 15. The piezoelectric layer 14 is provided on the insulating layer 15 so as to close the recessed portion. Thus, a hollow portion is provided. This hollow portion is a cavity portion 10*a*. In the present example embodiment, the support 13 and the piezoelectric layer 14 are disposed so that a portion of the support 13 and a portion of the piezoelectric layer 14 face each other with the cavity portion 10*a* therebetween. However, a recessed portion in the support 13 may be provided in the insulating layer 15 and in the support substrate 16. Alternatively, a recessed portion that is provided only in the support substrate 16 may be closed by the insulating layer 15. A recessed portion may be provided in the piezoelectric layer 14. The cavity portion 10*a* may be a through-hole provided in the support 13.

The IDT electrode 11 is provided on the first main surface 14*a* of the piezoelectric layer 14. The acoustic wave device 10 according to the present example embodiment is an acoustic wave resonator that is configured to be capable of using a thickness-shear-mode bulk wave.

In plan view, at least a portion of the IDT electrode 11 overlaps the cavity portion 10*a* of the piezoelectric substrate 12. In the present description, "in plan view" means viewing from the upper side in FIG. 2 in the stacking direction in which the support 13 and the piezoelectric layer 14 are stacked. In FIG. 2, for example, the upper side is the piezoelectric layer 14 side, between the support substrate 16 side and the piezoelectric layer 14 side.

As illustrated in FIG. 1, the IDT electrode 11 includes a pair of busbars and a plurality of electrode fingers. The pair of busbars are specifically a first busbar 26 and a second busbar 27. The first busbar 26 and the second busbar 27 face each other. The plurality of electrode fingers are specifically a plurality of first electrode fingers 28 and a plurality of second electrode fingers 29. One end of each of the plurality of first electrode fingers 28 is connected to the first busbar 26. One end of each of the plurality of second electrode fingers 29 is connected to the second busbar 27. The plurality of first electrode fingers 28 and the plurality of second electrode fingers 29 interdigitate with each other. The IDT electrode 11 may include a single-layer metal film or may include a multilayer metal film.

Hereafter, the first electrode finger 28 and the second electrode finger 29 may be simply referred to as an electrode finger. The first busbar 26 and the second busbar 27 may be simply referred to as a busbar. When an electrode-finger-extending direction is defined as a direction in which a plurality of electrode fingers extend and an electrode-finger-facing direction is defined as a direction in which adjacent electrode fingers face each other, the electrode-finger-extending direction and the electrode-finger-facing direction are perpendicular to each other in the present example embodiment.

In the acoustic wave device 10, d/p is less than or equal to about 0.5, for example, where d is the thickness of the piezoelectric layer 14 and p is the center-to-center distance between adjacent electrode fingers. Thus, a thickness-shear-mode bulk wave is appropriately excited.

The cavity portion 10*a* illustrated in FIG. 2 corresponds to an acoustic reflector according to an example embodiment of the present invention. The acoustic reflector can effectively confine the energy of an acoustic wave in the piezoelectric layer 14 side. As the acoustic reflector, an acoustic reflective film, such as an acoustic multilayer film described below, may be provided.

Referring back to FIG. 1, the IDT electrode 11 has a crossing region F. The crossing region F is a region in which adjacent electrode fingers overlap each other when seen from the electrode-finger-facing direction. The crossing region F includes a central region H and a pair of edge regions. The pair of edge regions are specifically a first edge region E1 and a second edge region E2. The first edge region E1 and the second edge region E2 are disposed so as to face each other with the central region H therebetween in the electrode-finger-extending direction. The first edge region E1 is located on the first busbar 26 side. The second edge region E2 is located on the second busbar 27 side.

The IDT electrode 11 has a pair of gap regions. The pair of gap regions are located between the crossing region F and the pair of busbars. The pair of gap region are specifically a first gap region G1 and a second gap region G2. The first gap region G1 is located between the first busbar 26 and the first edge region E1. The second gap region G2 is located between the second busbar 27 and the second edge region E2.

FIG. 3 is a schematic cross-sectional view taken along line II-II in FIG. 1, illustrating the vicinity of the first gap region.

A first mass-adding film 24 and a second mass-adding film 25 are provided on the second main surface 14*b* of the piezoelectric layer 14. To be more specific, the first mass-adding film 24 overlaps the first gap region G1 in plan view. The second mass-adding film 25 overlaps the first edge region E1 in plan view. The first mass-adding film 24 and the second mass-adding film 25 are each included in a mass-adding film in an example embodiment of the present invention. However, the second mass-adding film 25 need not be provided.

In the present example embodiment, the first mass-adding film 24 and the second mass-adding film 25 are integrally formed from the same material. The first mass-adding film 24 and the second mass-adding film 25 may be independently provided. The first mass-adding film 24 and the second mass-adding film 25 may be formed from materials that differ from each other. In the present description, "a member is made of a material" includes a case where the material includes an impurity with an amount that does not significantly impair the electric characteristics of an acoustic wave device.

In the present example embodiment, the thickness of the first mass-adding film 24 and the thickness the second mass-adding film 25 are the same. The thickness of the first mass-adding film 24 and the thickness of the second mass-adding film 25 may differ from each other.

Referring back to FIG. 1, the acoustic wave device 10 includes a pair of first mass-adding films 24 and a pair of second mass-adding films 25. As described above, one of the pair of first mass-adding films 24 overlaps the first gap region G1 in plan view. The other first mass-adding film 24 overlaps the second gap region G2 in plan view. Likewise, as described above, one of the pair of second mass-adding films 25 overlaps the first edge region E1 in plan view. The other second mass-adding film 25 overlaps the second edge region E2 in plan view. However, the mass-adding films, including the first mass-adding films 24 and the second mass-adding films 25, do not overlap the central region H in plan view.

Each first mass-adding film 24 and each second mass-adding film 25 have a strip shape. To be more specific, each first mass-adding film 24 and each second mass-adding film 25 overlap a plurality of electrode fingers in plan view.

In the present example embodiment, each first mass-adding film 24 is provided in a portion of each gap region in the electrode-finger-extending direction. Each first mass-adding film 24 may be provided in the entirety of each gap region in the electrode-finger-extending direction.

One of the unique features of the present example embodiment is that at least one first mass-adding film 24 overlaps the first gap region G1 or the second gap region G2 in plan view and is provided on the second main surface 14*b* of the piezoelectric layer 14. Thus, it is possible to reduce or prevent unnecessary waves and it is possible to reduce insertion loss in a band between a resonant frequency and an anti-resonant frequency. Details of this effect will be described below by comparing the present example embodiment with a reference example and a comparative example. Hereafter, unless otherwise noted, "unnecessary waves" refer to unnecessary waves that are generated in a band between a resonant frequency and an anti-resonant frequency.

Figure 4:
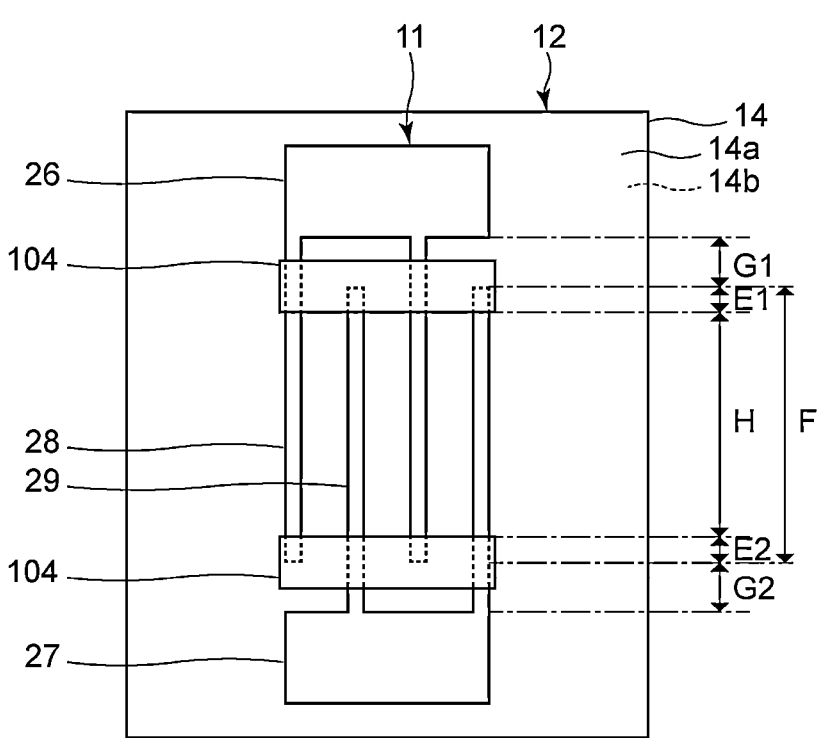
FIG. 4 is a schematic plan view of an acoustic wave device according to a reference example.

As illustrated in FIG. 4, the reference example differs from the first example embodiment in that a pair of mass-adding films 104 are provided on the first main surface 14*a* of the piezoelectric layer 14 so as to cover a plurality of electrode fingers. The pair of mass-adding films 104 are provided in a pair of edge regions and in a pair of gap regions. On the other hand, the comparative example differs from the first example embodiment in that the comparative example does not include a mass-adding film. The admittance Y11 of each of the acoustic wave devices according to the first example embodiment, the reference example, and the comparative example is measured. In each acoustic wave device, the resonant frequency is approximately 4740 MHz and the anti-resonant frequency is approximately 5470 MHz, for example.

Figure 5:
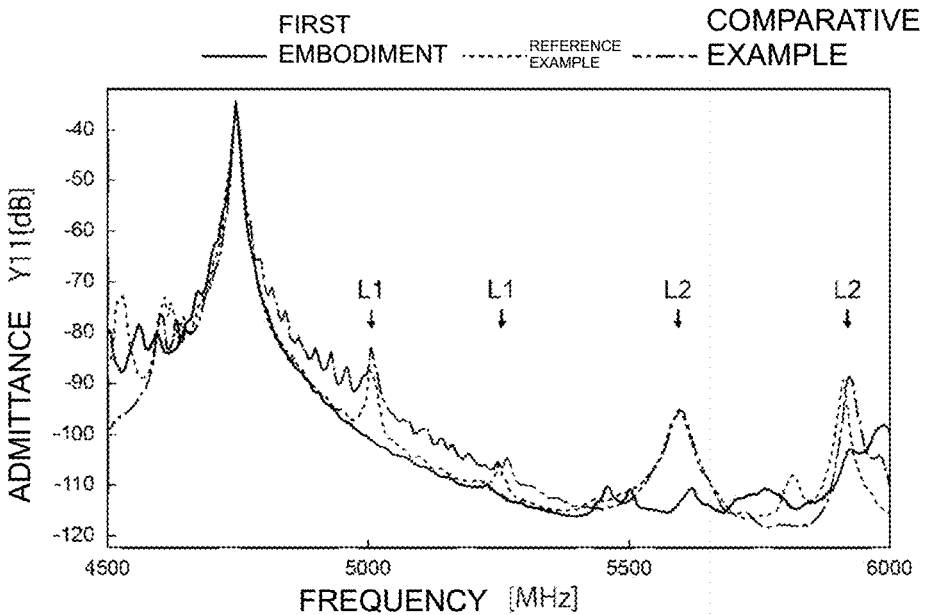
FIG. 5 is a graph illustrating the admittance frequency characteristics of the first example embodiment, the reference example, and a comparative example, in the vicinity of a range between a resonant frequency and an anti-resonant frequency.

FIG. 5 is a graph illustrating the admittance frequency characteristics of the first example embodiment, the reference example, and the comparative example, in the vicinity of a range between the resonant frequency and the anti-resonant frequency. Hereafter, regarding the frequency characteristics of an acoustic wave device, "in-band ripple" refers to a ripple that is generated between a resonant frequency and an anti-resonant frequency.

As indicated by each arrow L1 in FIG. 5, in each of the reference example and the comparative example, a plurality of in-band ripples due to unnecessary waves are generated. In contrast, in the first example embodiment, it can be seen that any in-band ripple is suppressed. In this way, with the first example embodiment, it is possible to reduce or prevent unnecessary waves in the band between the resonant frequency and the anti-resonant frequency. Moreover, as indicated by each arrow L2, in each of the reference example and the comparative example, a plurality of out-of-band ripples due to unnecessary waves are generated. In contrast, in the first example embodiment, it can be seen that an out-of-band ripple is also suppressed. In this way, with the first example embodiment, it is possible to reduce or prevent unnecessary waves also out of band.

Between the resonant frequency and the anti-resonant frequency, insertion loss decreases as admittance decreases. As illustrated in FIG. 5, in the first example embodiment, it is possible to reduce insertion loss particularly in the vicinity of the anti-resonant frequency. This is because, as illustrated in FIG. 1, the first mass-adding films 24 overlap the first gap region G1 and the second gap region G2 in plan view and are provided on the second main surface 14*b* of the piezoelectric layer 14. Thus, it is possible to reduce or prevent displacement in the Y-axis direction in the crystal axis of the piezoelectric layer 14. Thus, it is possible to reduce insertion loss.

In the first example embodiment, since each second mass-adding film 25 is provided, a low-acoustic-velocity region is configured in each edge region. A "low-acoustic-velocity region" is a region in which acoustic velocity is lower than that in the central region H. In the electrode-finger-extending direction, the central region H and the low-acoustic-velocity region are arranged in this order from the inside toward the outside of the IDT electrode 11. Thus, a piston mode is established and it is possible to effectively reduce or prevent unnecessary waves.

An acoustic wave device according to an example embodiment of the present invention does not use a surface acoustic wave but uses a thickness-shear-mode bulk wave. In this case, it is possible to appropriately establish a piston mode even when each first mass-adding film 24 overlaps each gap region in plan view.

In an acoustic wave device that uses a thickness-shear-mode bulk wave, the crossing region F illustrated in FIG. 1 includes a plurality of excitation regions. To be specific, an excitation region is a region where adjacent electrode fingers overlap when seen from the electrode-finger-facing direction and that is between the centers of the adjacent electrode fingers.

As the material of the first mass-adding film 24 and the second mass-adding film 25, it is preferable that at least one dielectric selected from the group consisting of silicon oxide, tungsten oxide, niobium oxide, tantalum oxide, and hafnium oxide be used. When any of the above materials is used in the first mass-adding film 24, it is possible to more reliably reduce or prevent unnecessary waves in a band between a resonant frequency and an anti-resonant frequency. Likewise, when any of the above materials is used in the second mass-adding film 25, it is possible to more reliably and effectively reduce or prevent unnecessary waves.

As described above, in the first example embodiment, each first mass-adding film 24 is provided in each gap region. It is sufficient that the first mass-adding film 24 be provided so as to overlap at least one of the first gap region G1 and the second gap region G2 in plan view. However, it is preferable that the first mass-adding film 24 be provided in each of the first gap region G1 and the second gap region G2. Thus, it is possible to more reliably reduce or prevent unnecessary waves in a band between a resonant frequency and an anti-resonant frequency.

It is sufficient that the first mass-adding film 24 overlap at least a portion of the first gap region G1 or the second gap region G2 in plan view. To be more specific, it is sufficient that the first mass-adding film 24 overlap, in plan view, at least a portion of the first gap region G1 or the second gap region G2 in the electrode-finger-extending direction. It is sufficient that the first mass-adding film 24 overlap, in plan view, at least a portion of the first gap region G1 or the second gap region G2 in the electrode-finger-facing direction.

When the first mass-adding film 24 overlaps the first gap region G1 in plan view, it is preferable that the first mass-adding film 24 overlap a plurality of first electrode fingers 28 in plan view. It is more preferable that the first mass-adding film 24 overlap all first electrode fingers 28 in plan view. In these cases, it is preferable that, in plan view, the first mass-adding film 24 be continuously provided in a region that overlaps the plurality of first electrode fingers 28 and a region that overlaps a portion between the first electrode fingers 28. Thus, it is possible to more reliably and effectively reduce or prevent unnecessary waves.

When the first mass-adding film 24 overlaps the second gap region G2 in plan view, it is preferable that the first mass-adding film 24 overlap a plurality of second electrode fingers 29 in plan view. It is more preferable that the first mass-adding film 24 overlaps all second electrode fingers 29 in plan view. In these cases, it is preferable that, in plan view, the first mass-adding film 24 be continuously provided in a region that overlaps the plurality of second electrode fingers 29 and a region that overlaps a portion between the second electrode fingers 29. Thus, it is possible to more reliably and effectively reduce or prevent unnecessary waves.

The second mass-adding film 25 need not be provided. However, it is preferable that the second mass-adding film 25 overlap, in plan view, an edge region that is adjacent to a gap region that the first mass-adding film 24 overlaps in plan view. Thus, as described above, it is possible to effectively reduce or prevent unnecessary waves.

It is sufficient that the second mass-adding film 25 overlap at least one electrode finger in plan view. However, it is preferable that the second mass-adding film 25 overlap a plurality of electrode fingers in plan view, and it is more preferable that the second mass-adding film 25 overlap all electrode fingers. In these cases, it is preferable that, in plan view, the second mass-adding film 25 be continuously provided in a region that overlaps the plurality of electrode fingers and a region that overlaps a portion between the electrode fingers. Thus, it is possible to more reliably and effectively reduce or prevent unnecessary waves.

Hereafter, a first modification and second modification of the first example embodiment, which differ from the first example embodiment only in the configuration of the first mass-adding film, will be described. Also with the first modification and the second modification, as with the first example embodiment, it is possible to reduce or prevent unnecessary waves and it is possible to reduce or prevent insertion loss in a band between a resonant frequency and an anti-resonant frequency.

Figure 6:
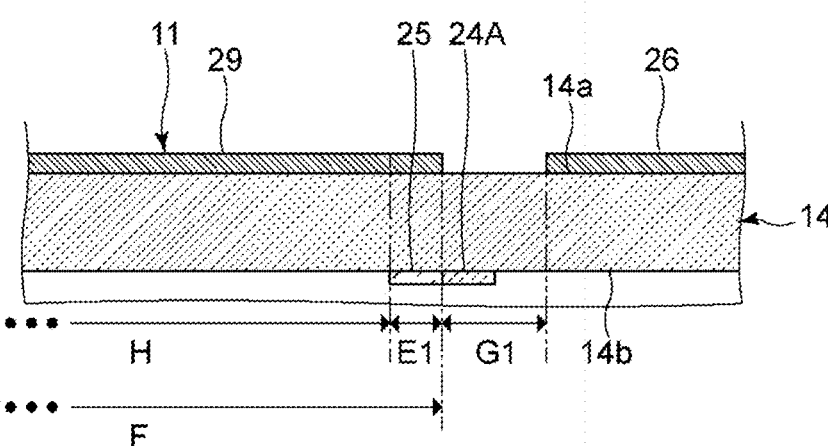
FIG. 6 is a schematic cross-sectional view of an acoustic wave device according to a first modification of the first example embodiment of the present invention, illustrating a cross section corresponding to that illustrated in FIG. 3.

In the first modification illustrated FIG. 6, the material of a first mass-adding film 24A and the material of the second mass-adding film 25 differ from each other.

Figure 7:
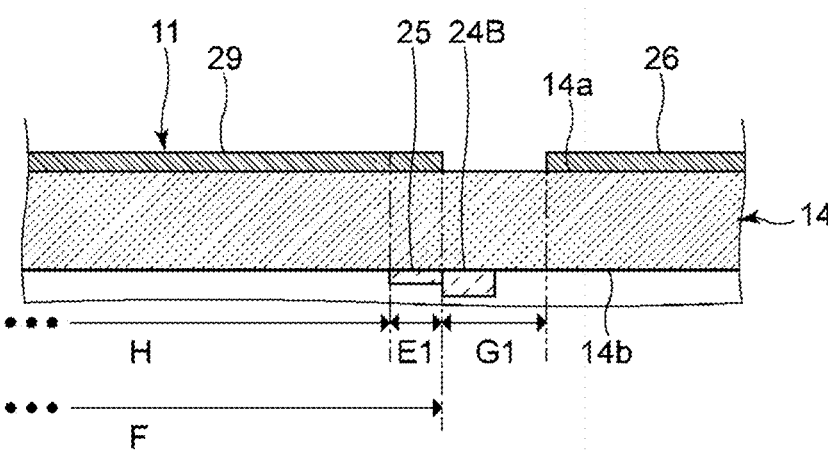
FIG. 7 is a schematic cross-sectional view of an acoustic wave device according to a second modification of the first example embodiment of the present invention, illustrating a cross section corresponding to that illustrated in FIG. 3.

In the second modification illustrated FIG. 7, the thickness of a first mass-adding film 24B and the thickness of the second mass-adding film 25 differ from each other. To be specific, the thickness of the first mass-adding film 24B is greater than the thickness of the second mass-adding film 25. The thickness of the first mass-adding film 24B may be less than the thickness of the second mass-adding film 25. However, by making the thickness of the first mass-adding film 24B greater as in the present modification, it is possible to reliably reduce insertion loss and it is possible to effectively reduce or prevent unnecessary waves.

Also in the present modification, as with the first modification, the material of the first mass-adding film 24B and the material of the second mass-adding film 25 may differ from each other. Also in this case, it is possible to reduce or prevent unnecessary waves and it is possible to reduce insertion loss.

Moreover, hereafter, a third modification and a fourth modification of the first example embodiment, which are examples in which the second mass-adding film 25 illustrated in FIG. 1 is not provided, will be described. Also with the third modification and the fourth modification, as with the first example embodiment, it is possible to reduce or prevent unnecessary waves and it is possible to reduce insertion loss in a band between a resonant frequency and an anti-resonant frequency.

Figure 8:
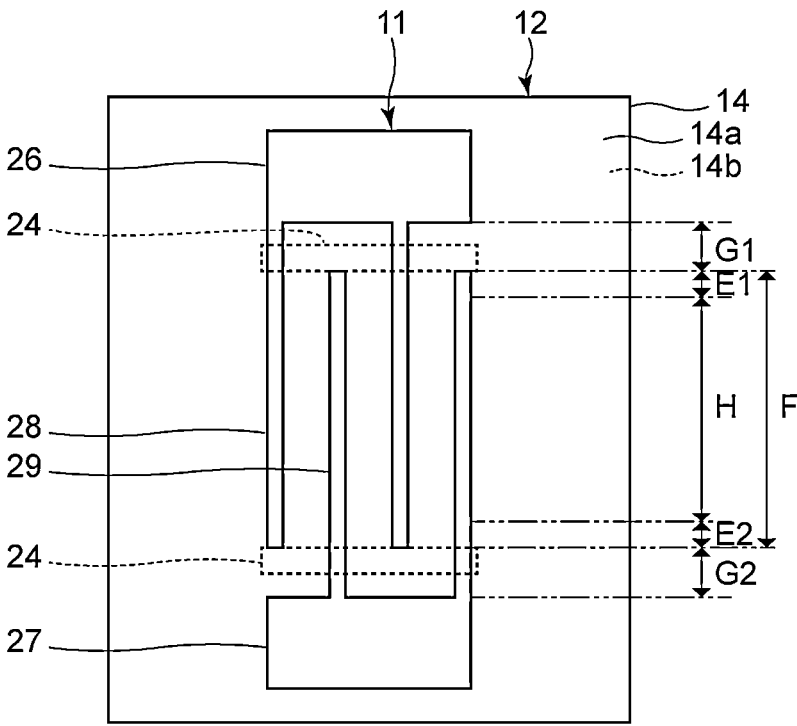
FIG. 8 is a schematic plan view of an acoustic wave device according to a third modification of the first example embodiment of the present invention.

In the third modification illustrated in FIG. 8, a second mass-adding film is not provided. In the present modification, the first mass-adding film 24 is the only mass-adding film. Each first mass-adding film 24 overlaps, in plan view, a portion of each gap region in the electrode-finger-extending direction.

Figure 9:
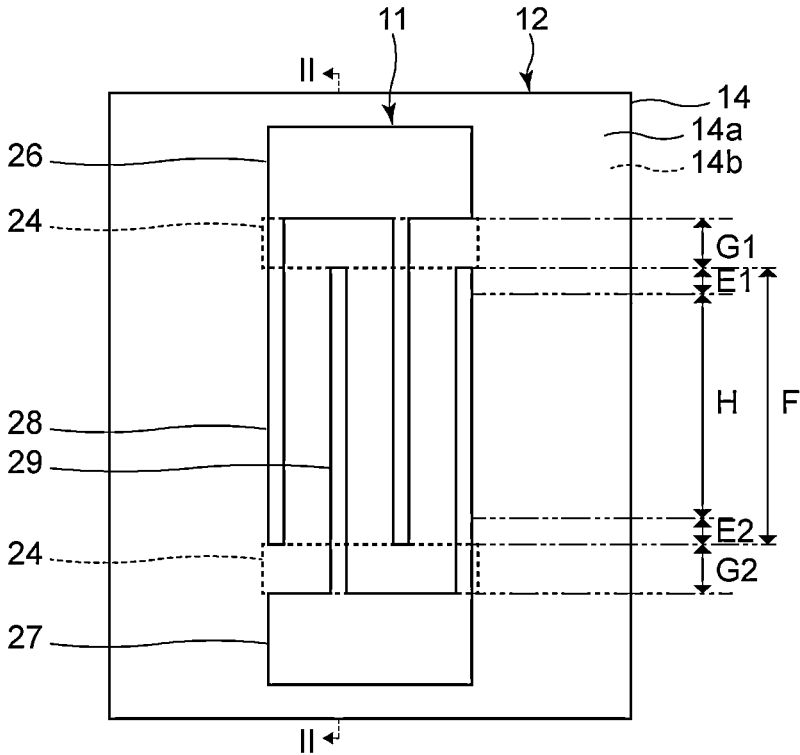
FIG. 9 is a schematic plan view of an acoustic wave device according to a fourth modification of the first example embodiment of the present invention.
Figure 10:
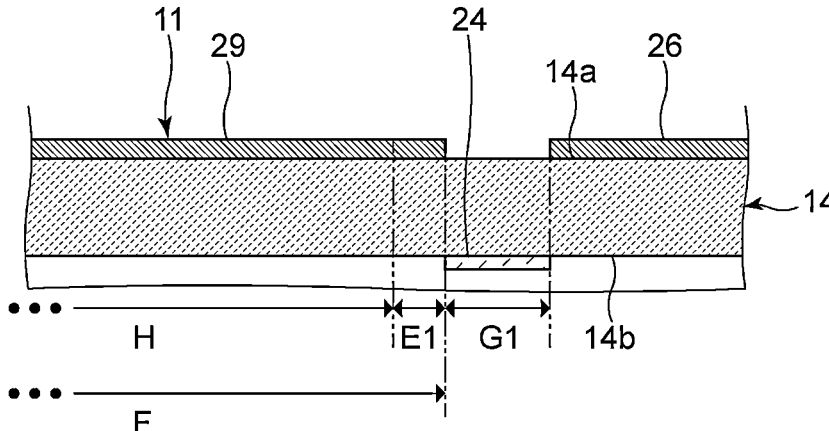
FIG. 10 is a schematic cross-sectional view taken along line II-II in FIG. 9, illustrating the vicinity of a first gap region.

Also in a fourth modification illustrated in FIG. 9, a second mass-adding film is not provided. As illustrated in FIG. 10, in the present modification, one of the pair of first mass-adding films 24 overlaps the entirety of the first gap region G1 in plan view. Likewise, as illustrated in FIG. 9, the other first mass-adding film 24 overlaps the entirety of the second gap region G2 in plan view.

Figure 11:
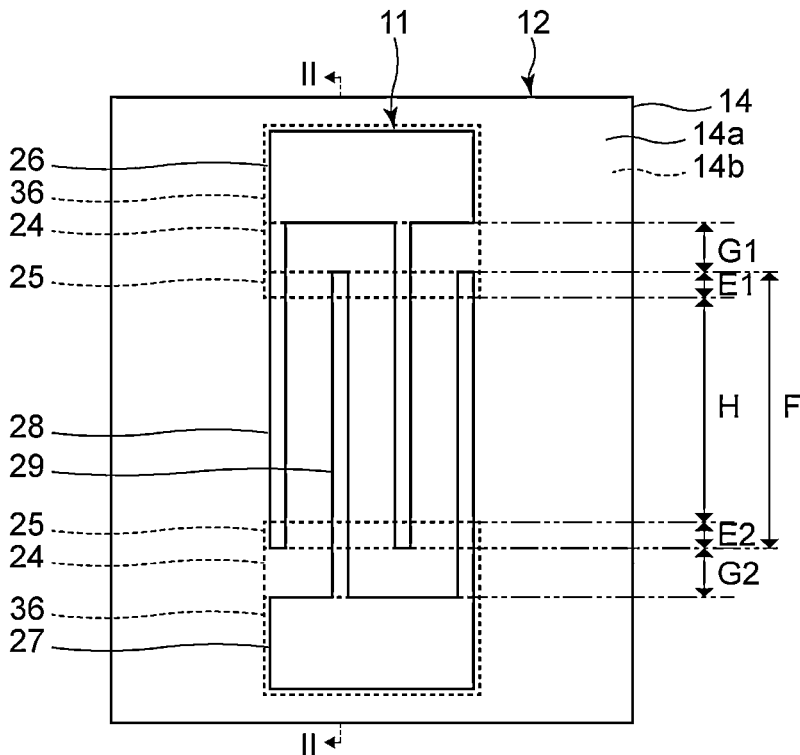
FIG. 11 is a schematic plan view of an acoustic wave device according to a second example embodiment of the present invention.
Figure 12:
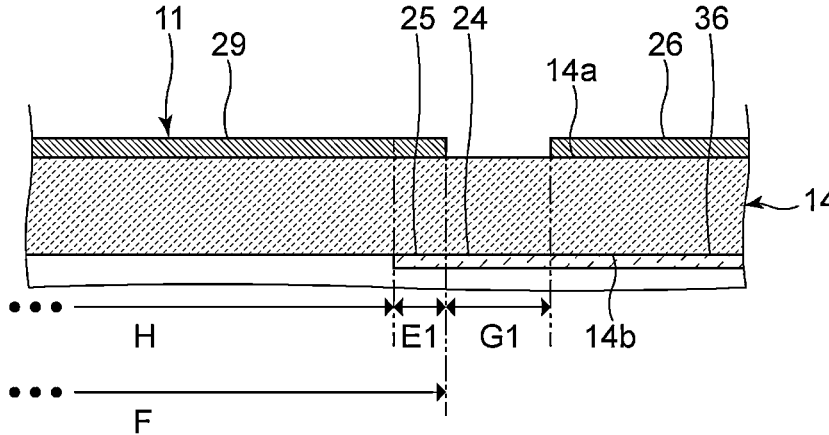
FIG. 12 is a schematic cross-sectional view taken along line II-II in FIG. 11, illustrating the vicinity of a first gap region.

FIG. 11 is a schematic plan view of an acoustic wave device according to a second example embodiment. FIG. 12 is a schematic cross-sectional view taken along line II-II in FIG. 11, illustrating the vicinity of a first gap region.

As illustrated in FIGS. 11 and 12, the present example embodiment differs from the first example embodiment in that a mass-adding film includes a third mass-adding film 36, in addition to the first mass-adding film 24 and the second mass-adding film 25. The present example embodiment differs from the first example embodiment also in that a pair of first mass-adding films 24 respectively overlap the entireties of a pair of gap regions in plan view. In other respects, the acoustic wave device according to the present example embodiment has a configuration similar to that of the acoustic wave device 10 according to the first example embodiment.

A pair of third mass-adding film 36 are provided on the second main surface 14b of the piezoelectric layer 14. One of the pair of third mass-adding films 36 overlaps the first busbar 26 in plan view. As illustrated in FIG. 11, the other third mass-adding film 36 overlaps the second busbar 27 in plan view. Also when the third mass-adding film 36 is provided as in the present example embodiment, as with the first example embodiment, it is possible to reduce or prevent unnecessary waves and it is possible to reduce insertion loss in a band between a resonant frequency and an anti-resonant frequency.

It is sufficient that at least one third mass-adding film 36 be provided. It is sufficient that the third mass-adding film 36 overlap at least one of the first busbar 26 and the second busbar 27 in plan view. To be more specific, it is sufficient that the third mass-adding film 36 overlap, in plan view, a busbar that is adjacent to a gap region that the first mass-adding film 24 overlaps in plan view.

In the present example embodiment, each third mass-adding film 36 overlaps the entirety of each busbar in plan view. However, it is sufficient that the third mass-adding film 36 overlap at least a portion of the first busbar 26 or at least a portion of the second busbar 27 in plan view.

The first mass-adding film 24, the second mass-adding film 25, and the third mass-adding film 36 are integrally formed from the same material. However, the material of the first mass-adding film 24 and the material of the third mass-adding film 36 may differ from each other.

As illustrated in FIG. 12, the thickness of the first mass-adding film 24 and the thickness of the third mass-adding film 36 are the same. However, the thickness of the first mass-adding film 24 and the thickness of the third mass-adding film 36 may differ from each other.

Figure 13:
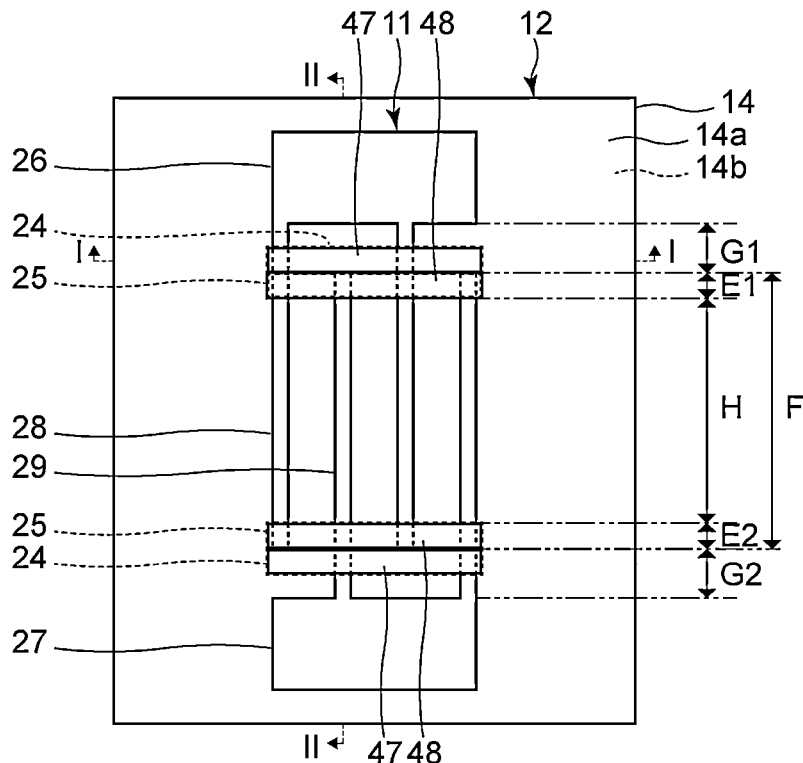
FIG. 13 is a schematic plan view of an acoustic wave device according to a third example embodiment of the present invention.
Figure 14:
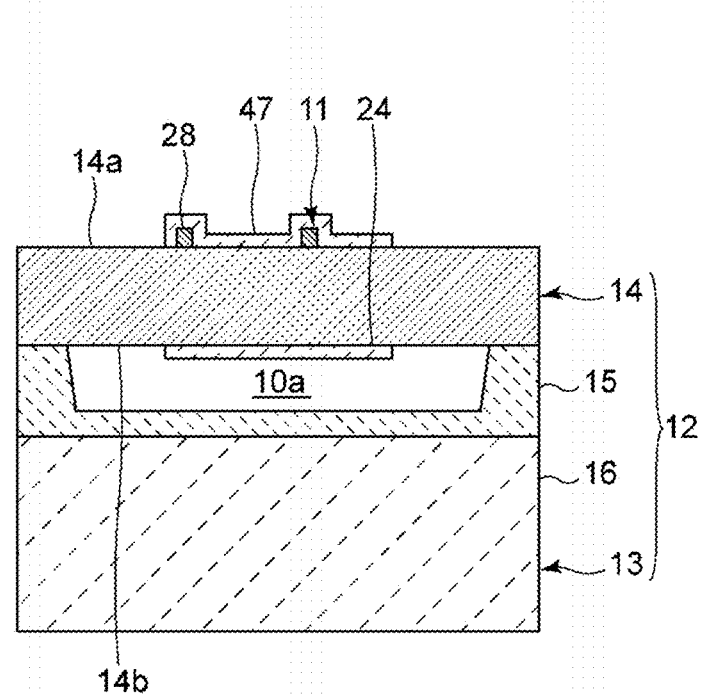
FIG. 14 is a schematic cross-sectional view taken along line I-I in FIG. 13.

FIG. 13 is a schematic plan view of an acoustic wave device according to a third example embodiment. FIG. 14 is a schematic cross-sectional view taken along line I-I in FIG.

Figure 15:
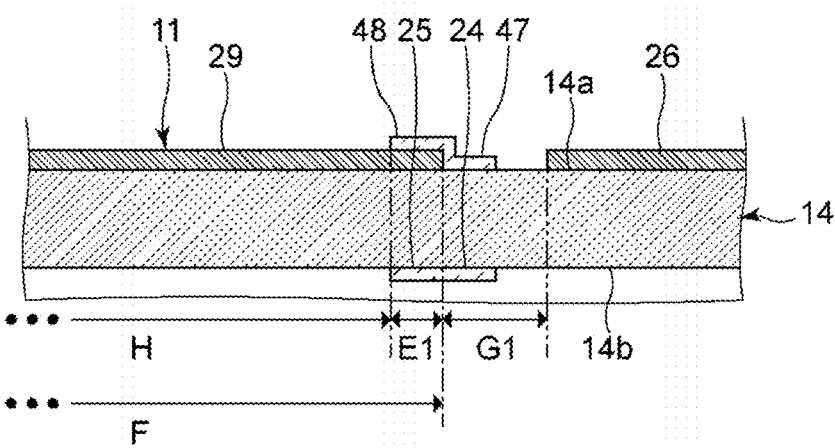
FIG. 15 is a schematic cross-sectional view taken along line II-II in FIG. 13, illustrating the vicinity of a first gap region.

13. FIG. 15 is a schematic cross-sectional view taken along line II-II in FIG. 13, illustrating the vicinity of a first gap region.

As illustrated in FIG. 13, the present example embodiment differs from the first example embodiment in that a mass-adding film includes a fourth mass-adding film 47 and a fifth mass-adding film 48, in addition to the first mass-adding film 24 and the second mass-adding film 25. In other respects, the acoustic wave device according to the present example embodiment has a configuration similar to that of the acoustic wave device 10 according to the first example embodiment.

Also when the fourth mass-adding film 47 and the fifth mass-adding film 48 are provided, as with the first example embodiment, it is possible to reduce or prevent unnecessary waves and it is possible to reduce insertion loss in a band between a resonant frequency and an anti-resonant frequency. Hereafter, details of the configuration of the present example embodiment will be described.

A pair of fourth mass-adding films 47 are provided on the first main surface 14*a* of the piezoelectric layer 14. One of the pair of fourth mass-adding films 47 overlaps the first gap region G1 in plan view. The other fourth mass-adding film 47 overlaps the second gap region G2 in plan view.

To be specific, in the present example embodiment, the pair of fourth mass-adding films 47 are provided so as to respectively cover a plurality of electrode fingers. To be more specific, as illustrated in FIG. 14, one of the pair of fourth mass-adding films 47 is provided on the first main surface 14*a* of the piezoelectric layer 14 so as to cover a plurality of first electrode fingers 28 in the first gap region G1. Referring back to FIG. 13, the other fourth mass-adding film 47 is provided on the first main surface 14*a* so as to cover a plurality of second electrode fingers 29 in the second gap region G2.

It is sufficient that at least one fourth mass-adding film 47 be provided. It is sufficient that the first mass-adding film 24 and the fourth mass-adding film 47 overlap the same gap region in plan view. However, for example, when a pair of first mass-adding films 24 overlap both of the first gap region G1 and the second gap region G2 in plan view, one fourth mass-adding film 47 may overlap one of the gap regions in plan view.

It is sufficient that the fourth mass-adding film 47 overlap at least a portion of the first gap region G1 or the second gap region G2 in plan view. To be more specific, it is sufficient that the fourth mass-adding film 47 overlap, in plan view, at least a portion of the first gap region G1 or the second gap region G2 in the electrode-finger-extending direction. It is sufficient that the fourth mass-adding film 47 overlap, in plan view, at least a portion of the first gap region G1 or the second gap region G2 in the electrode-finger-facing direction.

When the fourth mass-adding film 47 overlaps the first gap region G1 in plan view, it is preferable that the fourth mass-adding film 47 overlap a plurality of first electrode fingers 28 in plan view. It is more preferable that the fourth mass-adding film 47 overlap all first electrode fingers 28 in plan view. In these cases, it is preferable that, in plan view, the fourth mass-adding film 47 be provided continuously in a region that overlaps the plurality of first electrode fingers 28 and a region that overlaps a portion between the first electrode fingers 28. Thus, it is possible to more reliably and effectively reduce or prevent unnecessary waves.

When the fourth mass-adding film 47 overlaps the second gap region G2 in plan view, it is preferable that the fourth mass-adding film 47 overlap a plurality of second electrode fingers 29 in plan view. It is more preferable that the fourth mass-adding film 47 overlap all second electrode fingers 29 in plan view. In these cases, it is preferable that, in plan view, the fourth mass-adding film 47 be continuously provided in a region that overlaps the plurality of second electrode fingers 29 and a region that overlaps a portion between the second electrode fingers 29. Thus, it is possible to more reliably and effectively reduce or prevent unnecessary waves.

As illustrated in FIG. 15, in the present example embodiment, the dimension of the first mass-adding film 24 in the electrode-finger-extending direction and the dimension of the fourth mass-adding film 47 in the electrode-finger-extending direction are the same. The entirety of the first mass-adding film 24 and the entirety of the fourth mass-adding film 47 overlap in plan view. However, the dimension of the first mass-adding film 24 in the electrode-finger-extending direction and the dimension of the fourth mass-adding film 47 in the electrode-finger-extending direction may differ from each other. For example, a pair of fourth mass-adding films 47 may respectively overlap the entireties of a pair of gap regions in plan view.

Referring back to FIG. 13, in the present example embodiment, a mass-adding film further includes the fifth mass-adding film 48. To be specific, a pair of fifth mass-adding films 48 are provided on the first main surface 14*a* of the piezoelectric layer 14. One of the pair of fifth mass-adding films 48 overlaps the first edge region E1 in plan view. The other fifth mass-adding film 48 overlaps the second edge region E2 in plan view.

Each of the pair of fifth mass-adding films 48 is provided so as to cover a plurality of electrode fingers. To be more specific, one of the pair of fifth mass-adding films 48 is provided on the first main surface 14*a* of the piezoelectric layer 14 so as to cover a plurality of electrode fingers in the first edge region E1. The other fifth mass-adding film 48 is provided on the first main surface 14*a* so as to cover a plurality of electrode fingers in the second edge region E2.

It is sufficient that at least one fifth mass-adding film 48 be provided. It is sufficient that the fifth mass-adding film 48 overlap, in plan view, an edge region that is adjacent to a gap region that the fourth mass-adding film 47 overlaps in plan view.

It is sufficient that the fifth mass-adding film 48 overlap at least one electrode finger in plan view. However, it is preferable that the fifth mass-adding film 48 overlap a plurality of electrode fingers in plan view, and it is more preferable that the fifth mass-adding film 48 overlap all electrode fingers. In these cases, it is preferable that, in plan view, the fifth mass-adding film 48 be continuously provided in a region that overlaps the plurality of electrode fingers and a region that overlaps a portion between the electrode fingers. Thus, it is possible to more reliably and effectively reduce or prevent unnecessary waves.

In the present example embodiment, the material of the first mass-adding film 24 and the material of the fourth mass-adding film 47 are the same. However, the material of the first mass-adding film 24 and the material of the fourth mass-adding film 47 may differ from each other.

On the other hand, in the present example embodiment, the material of the fourth mass-adding film 47 and the material of the fifth mass-adding film 48 are the same. However, the material of the fourth mass-adding film 47 and the material of the fifth mass-adding film 48 may differ from each other.

As the material of the fourth mass-adding film 47 and the fifth mass-adding film 48, it is preferable that at least one dielectric selected from the group consisting of silicon oxide, tungsten oxide, niobium oxide, tantalum oxide, and hafnium oxide be used. When any of the above materials is used in the fourth mass-adding film 47, it is possible to more reliably reduce or prevent unnecessary waves in a band between a resonant frequency and an anti-resonant frequency. Likewise, when any of the above materials is used in the fifth mass-adding film 48, it is possible to more reliably reduce or prevent unnecessary waves.

As illustrated in FIG. 15, the thickness of the fourth mass-adding film 47 and the thickness of the fifth mass-adding film 48 are the same. However, the thickness of the fourth mass-adding film 47 and the thickness of the fifth mass-adding film 48 may differ from each other.

As illustrated in FIG. 13, in the present example embodiment, each mass-adding film does not overlap the central region H in plan view.

Here, the admittance frequency characteristics of the present example embodiment are compared with those of a reference example and a comparative example. The reference example is the reference example illustrated in FIG. 4. The comparative example differs from the present example embodiment in that a mass-adding film is not provided. In each acoustic wave device, the resonant frequency is approximately 4740 MHz and the anti-resonant frequency is approximately 5470 MHz, for example.

Figure 16:
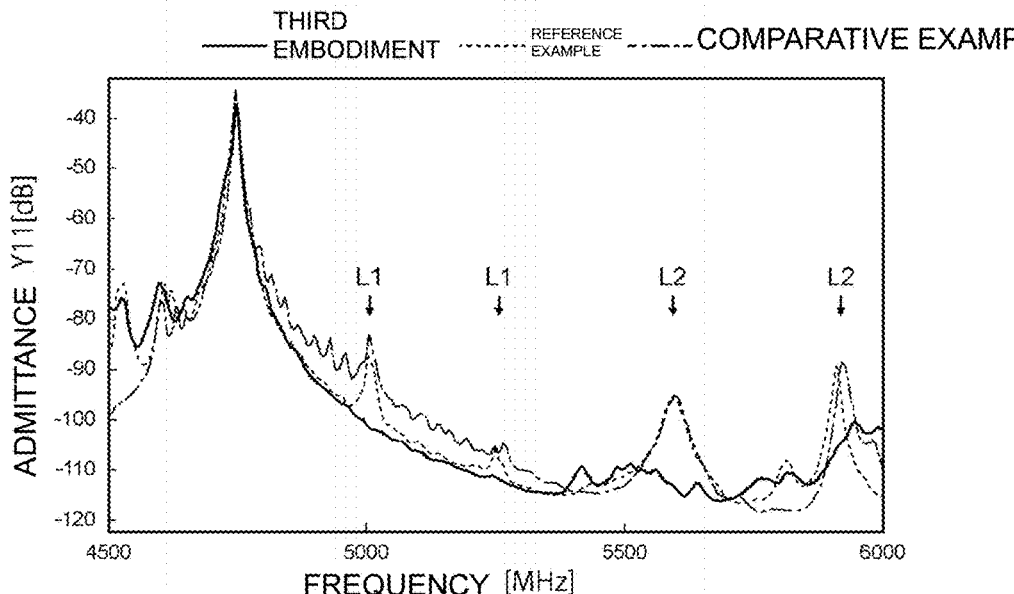
FIG. 16 is a graph illustrating the admittance frequency characteristics of the third example embodiment of the present invention, the reference example, and the comparative example, in the vicinity of a range between a resonant frequency and an anti-resonant frequency.

FIG. 16 is a graph illustrating the admittance frequency characteristics of the third example embodiment, the reference example, and the comparative example, in the vicinity of a range between the resonant frequency and the anti-resonant frequency. As indicated by each arrow L1 in FIG. 16, in each of the reference example and the comparative example, a plurality of in-band ripples due to unnecessary waves are generated. In contrast, in the third example embodiment, it can be seen that any in-band ripple is suppressed. In this way, with the third example embodiment, it is possible to reduce or prevent unnecessary waves in the band between the resonant frequency and the anti-resonant frequency. Moreover, in the third example embodiment, the admittance is small between the resonant frequency and the anti-resonant frequency. From this, it can be seen that insertion loss can be reduced. In addition, as indicated by each arrow L2, in each of the reference example and the comparative example, a plurality of out-of-band ripples due to unnecessary waves are generated. In contrast, in the third example embodiment, it can be seen that an out-of-band ripple is also suppressed. In this way, with the third example embodiment, it is possible to reduce or prevent unnecessary waves also out of band.

Hereafter, first to third modifications of the third example embodiment, which differ from the third example embodiment only in the configuration of the first mass-adding film, the fourth mass-adding film, or the fifth mass-adding film, will be described. Also with the first to third modifications, as with the third example embodiment, it is possible to reduce or prevent unnecessary waves and it is possible to reduce insertion loss in a band between a resonant frequency and an anti-resonant frequency.

Figure 17:
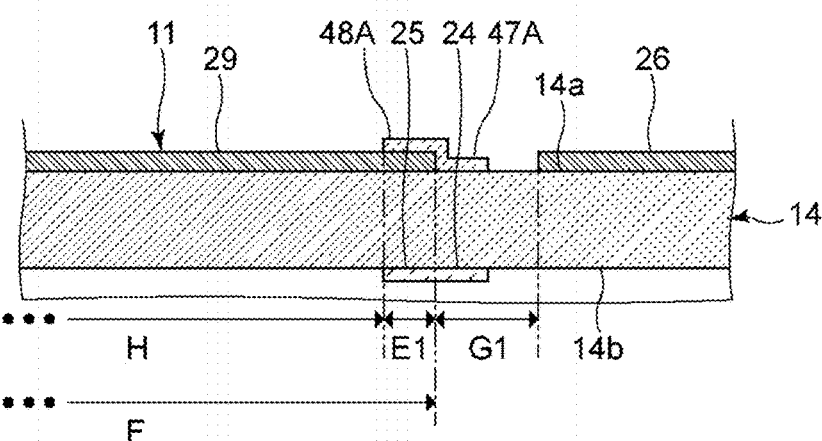
FIG. 17 is a schematic cross-sectional view of an acoustic wave device according to a first modification of the third example embodiment of the present invention, illustrating a cross section corresponding to that illustrated in FIG. 15.

In the first modification illustrated in FIG. 17, the material of the first mass-adding film 24 and the material of a fourth mass-adding film 47A and a fifth mass-adding film 48A differ from each other. The material of the fourth mass-adding film 47A and the material of the fifth mass-adding film 48A are the same.

Figure 18:
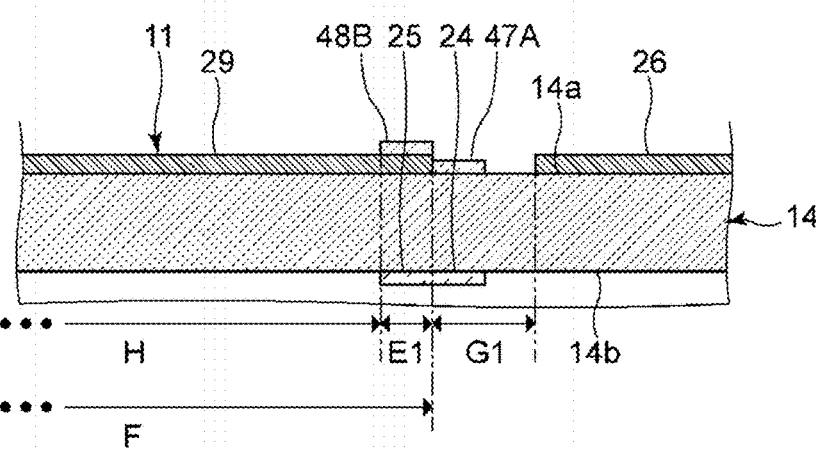
FIG. 18 is a schematic cross-sectional view of an acoustic wave device according to a second modification of the third example embodiment of the present invention, illustrating a cross section corresponding to that illustrated in FIG. 15.

In the second modification illustrated in FIG. 18, the material of the first mass-adding film 24, the material of the fourth mass-adding film 47A, and the material of a fifth mass-adding film 48B differ from each other.

Figure 19:
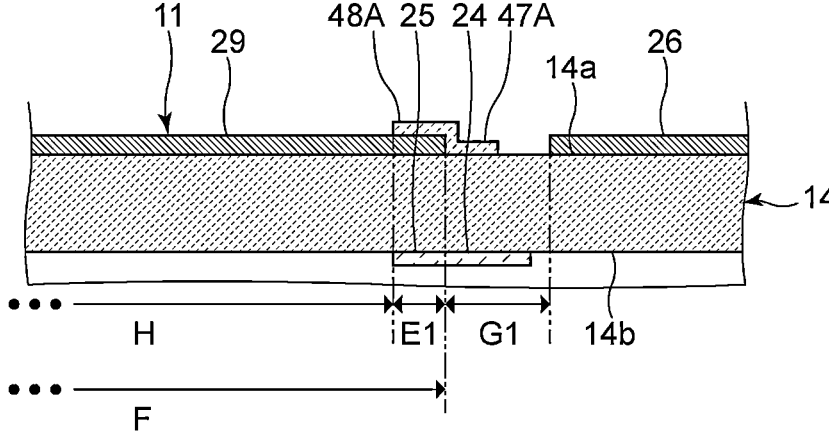
FIG. 19 is a schematic cross-sectional view of an acoustic wave device according to a third modification of the third example embodiment of the present invention, illustrating a cross section corresponding to that illustrated in FIG. 15.

In the third modification illustrated in FIG. 19, the dimension of the first mass-adding film 24 in the electrode-finger-extending direction and the dimension of the fourth mass-adding film 47A in the electrode-finger-extending direction differ from each other. To be specific, the dimension of the first mass-adding film 24 in the electrode-finger-extending direction is greater than the dimension of the fourth mass-adding film 47A in the electrode-finger-extending direction. However, the dimension of the first mass-adding film 24 in the electrode-finger-extending direction may be less than the dimension of the fourth mass-adding film 47A in the electrode-finger-extending direction.

In the present modification, as in the first modification, the material of the first mass-adding film 24 and the material of the fourth mass-adding film 47A and the fifth mass-adding film 48A differ from each other. However, the material of the first mass-adding film 24 and the material of the fourth mass-adding film 47A and the fifth mass-adding film 48A may be the same.

Figure 20:
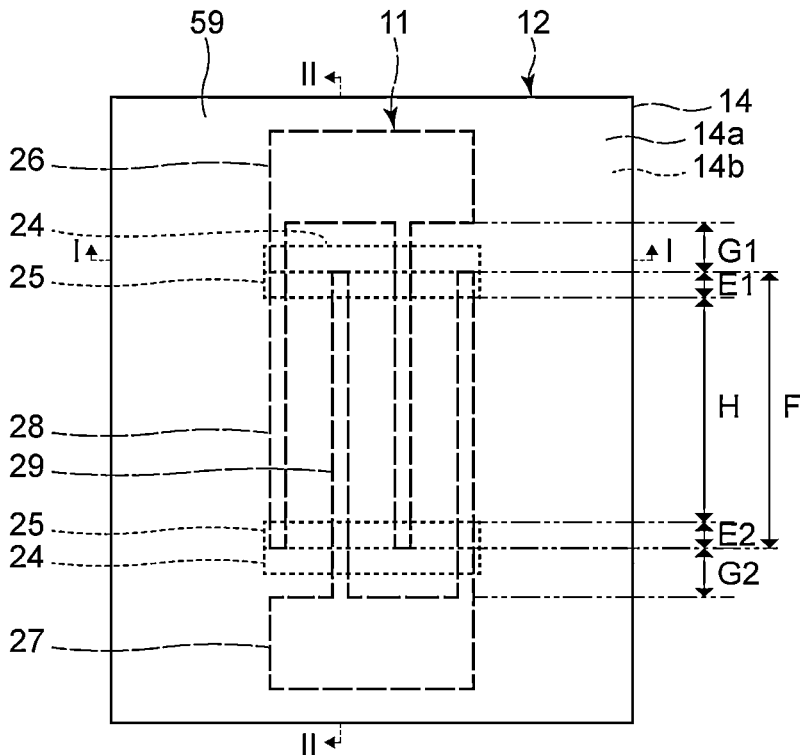
FIG. 20 is a schematic plan view of an acoustic wave device according to a fourth example embodiment of the present invention.
Figure 21:
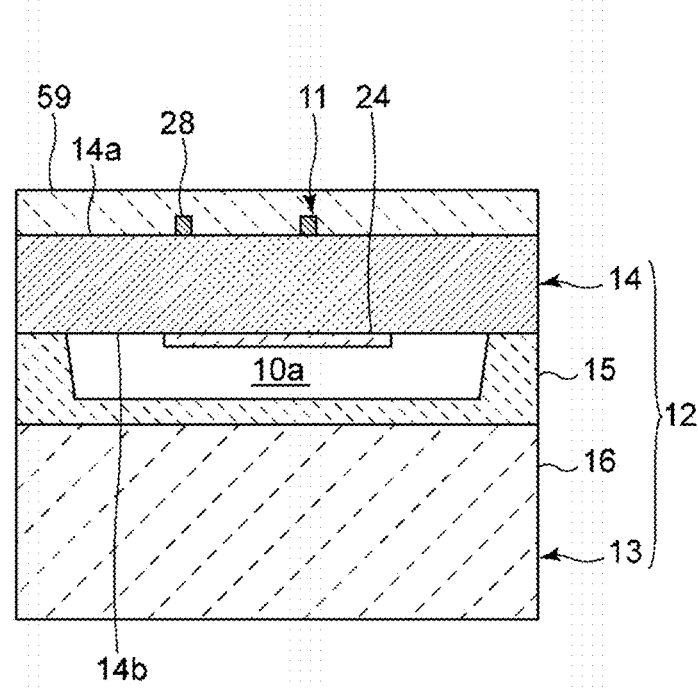
FIG. 21 is a schematic cross-sectional view taken along line I-I in FIG. 20.
Figure 22:
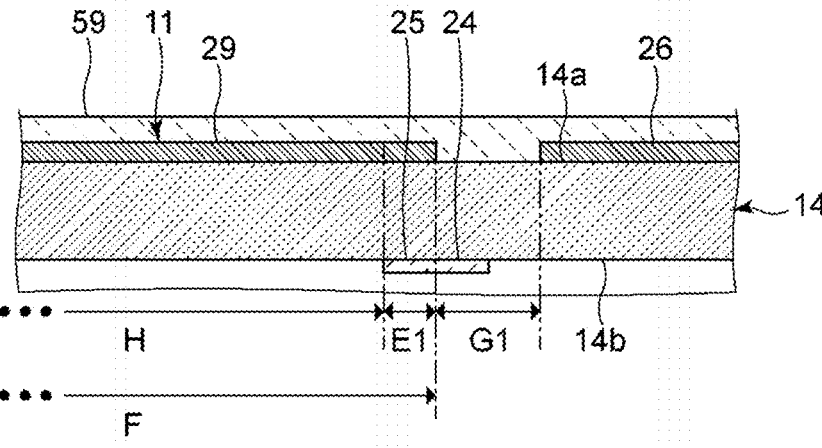
FIG. 22 is a schematic cross-sectional view taken along line II-II in FIG. 20, illustrating the vicinity of a first gap region.

FIG. 20 is a schematic plan view of an acoustic wave device according to a fourth example embodiment. FIG. 21 is a schematic cross-sectional view taken along line I-I in FIG. 20. FIG. 22 is a schematic cross-sectional view taken along line II-II in FIG. 20, illustrating the vicinity of a first gap region.

As illustrated in FIGS. 20 to 22, the present example embodiment differs from the first example embodiment in that a dielectric film 59 is provided on the first main surface 14a of the piezoelectric layer 14 so as to cover the IDT electrode 11. In other respects, the acoustic wave device according to the present example embodiment has a configuration similar to that of the acoustic wave device 10 according to the first example embodiment.

As the material of the dielectric film 59, it is possible to use, for example, silicon oxide, silicon nitride, or silicon oxynitride. The dielectric film 59 functions as a protective film for the IDT electrode 11. Thus, the IDT electrode 11 does not break easily. In addition, it is also possible to increase humidity resistance. Moreover, it is possible to easily adjust the frequency of the acoustic wave device by adjusting the thickness of the dielectric film 59.

Also with the configuration of the present example embodiment, as with the first example embodiment, it is possible to reduce or prevent unnecessary waves in a band between a resonant frequency and an anti-resonant frequency.

In the present example embodiment, the fourth mass-adding film 47 and the fifth mass-adding film 48 illustrated in FIG. 13 are not provided. However, as in the third example embodiment, the fourth mass-adding film 47 and the fifth mass-adding film 48 may be provided on the first main surface 14a of the piezoelectric layer 14. The fourth mass-adding film 47 and the fifth mass-adding film 48 may be covered by the dielectric film 59. Alternatively, the fourth mass-adding film 47 and the fifth mass-adding film 48 may be provided on the dielectric film 59. To be more specific, the dielectric film 59 may be provided between the piezoelectric layer 14 and the fourth and fifth mass-adding films 47 and 48.

When the material of the dielectric film 59 and the material of the fourth mass-adding film 47 are the same, the thickness of the dielectric film 59 is defined as the thickness of the dielectric film 59 in the central region H illustrated in FIG. 20. The thickness of the fourth mass-adding film 47 is defined as the difference between the total thickness of the dielectric film 59 and the fourth mass-adding film 47 and the thickness of the dielectric film 59. The same applies to a case where the material of the dielectric film 59 and the material of the fifth mass-adding film 48 are the same.

An acoustic wave device according to an example embodiment of the present invention can be used, for example, for a filter device. Examples of this will be described as a fifth example embodiment and a sixth example embodiment.

FIG. 23 is a circuit diagram of a filter device according to the fifth example embodiment.

A filter device 60 is a ladder filter. The filter device 60 includes a first signal terminal 62, a second signal terminal 63, a plurality of serial arm resonators, and a plurality of parallel arm resonators. In the present example embodiment, all serial arm resonators and all parallel arm resonators are acoustic wave resonators. All parallel arm resonators are acoustic wave devices according to example embodiments of the present invention. To be specific, each parallel arm resonator in the present example embodiment is the acoustic wave device according to the third modification of the first example embodiment illustrated in FIG. 8. However, each parallel arm resonator may have a configuration of the present invention other than that of the modification.

On the other hand, none of the serial arm resonators is an acoustic wave device according to an example embodiment of the present invention. To be specific, none of the serial arm resonators has a mass-adding film. However, it is sufficient that at least one parallel arm resonator of the filter device 60 be an acoustic wave device according to an example embodiment of the present invention. At least one serial arm resonator may be an acoustic wave device according to an example embodiment of the present invention.

The first signal terminal 62 and the second signal terminal 63 may be configured as, for example, electrode pads or may be configured as wiring. In the present example embodiment, the first signal terminal 62 is an antenna terminal. The antenna terminal is to be connected to an antenna.

The plurality of serial arm resonators of the filter device 60 are specifically a serial arm resonator S1, a serial arm resonator S2, and a serial arm resonator S3. The plurality of parallel arm resonators are specifically a parallel arm resonator P1 and a parallel arm resonator P2.

The serial arm resonator S1, the serial arm resonator S2, and the serial arm resonator S3 are connected serially to each other between the first signal terminal 62 and the second signal terminal 63. The parallel arm resonator P1 is connected between a ground potential and a connection point between the serial arm resonator S1 and the serial arm resonator S2. The parallel arm resonator P2 is connected between a ground potential and a connection point between the serial arm resonator S2 and the serial arm resonator S3. The circuit configuration of the filter device 60 is not limited to the one described above. It is sufficient that the filter device 60 include at least one serial arm resonator and at least one parallel arm resonator.

The filter device 60 includes a parallel arm resonator that is an acoustic wave device according to an example embodiment of the present invention. Thus, as with the first example embodiment and the like, it is possible to reduce or prevent unnecessary waves in the parallel arm resonator of the filter device 60. In addition, it is possible to reduce the insertion loss of the filter device 60.

FIG. 24A is a schematic plan view of a parallel arm resonator in the fifth example embodiment. FIG. 24B is a schematic plan view of a serial arm resonator in the fifth example embodiment.

As illustrated in FIGS. 24A and 24B, the width W of a gap region is defined as the dimension of each gap region in the electrode-finger-extending direction. In the filter device 60, the width W of the gap region of any of the parallel arm resonators is greater than the width of the gap region of any of the serial arm resonators. Thus, it is possible to more reliably improve the filter characteristics of the filter device 60. In addition, each parallel arm resonator is an acoustic wave device according to an example embodiment of the present invention. To be specific, in each parallel arm resonator, a pair of first mass-adding films 24 are provided on the second main surface 14b of the piezoelectric layer 14 so as to overlap each gap region in plan view. Thus, even when the width W of each gap region is large, it is possible to reduce or prevent unnecessary waves in a band between a resonant frequency and an anti-resonant frequency.

As described above, some parallel arm resonators among all parallel arm resonators may be acoustic wave devices according to example embodiments of the present invention. In this case, it is sufficient that the width W of a gap region of each parallel arm resonator that is an acoustic wave device according to an example embodiment of the present invention be greater than the width W of a gap region of the serial arm resonator. In this case, it is possible to more reliably achieve both of improvement of filter characteristics and suppression of unnecessary waves.

Hereafter, a filter device according to the sixth example embodiment will be described. The sixth example embodiment differs from the fifth example embodiment in that all serial arm resonators are acoustic wave devices according to example embodiments of the present invention. The circuit configuration of the filter device according to the sixth example embodiment is similar to the configuration illustrated in FIG. 23.

All parallel arm resonators in the sixth example embodiment are first acoustic wave resonators in an example embodiment of the present invention. On the other hand, all serial arm resonators are second acoustic wave resonators in an example embodiment of the present invention. It is sufficient that at least one parallel arm resonator be the first acoustic wave resonator. It is sufficient that at least one serial arm resonator be the second acoustic wave resonator.

FIG. 25A is a schematic plan view of a first acoustic wave resonator in the sixth example embodiment. FIG. 25B is a schematic plan view of a second acoustic wave resonator in the sixth example embodiment.

In the sixth example embodiment, all first acoustic wave resonators and all second acoustic wave resonators are acoustic wave devices each according to the third modification of the first example embodiment. Thus, as with the first example embodiment and the like, it is possible to reduce or prevent unnecessary waves in the parallel arm resonator and the serial arm resonator of the filter device. In addition, it is possible to reduce the insertion loss of the filter device. However, each first acoustic wave resonator and each second acoustic wave resonator may have a configuration of an example embodiment of the present invention different from that of the modification.

As illustrated in FIGS. 25A and 25B, the width W of a gap region in the parallel arm resonator as a first acoustic wave resonator is greater than the width W of a gap region in the serial arm resonator as a second acoustic wave resonator. Thus, it is possible to more reliably improve the filter characteristics of a filter device.

In addition, the dimension of the first mass-adding film 24 of the first acoustic wave resonator in the electrode-finger-extending direction is greater than the dimension of the first mass-adding film 24 of the second acoustic wave resonator in the electrode-finger-extending direction. Thus, even when the width W of a gap region in each first acoustic wave resonator is large, it is possible to reduce or prevent unnecessary waves in a band between a resonant frequency and an anti-resonant frequency.

Hereafter, details of a thickness shear mode will be described. An "electrode" in an IDT electrode described below corresponds to an electrode finger in an example embodiment of the present invention. A support in the following example corresponds to a support substrate in an example embodiment of the present invention.

Figure 26A:
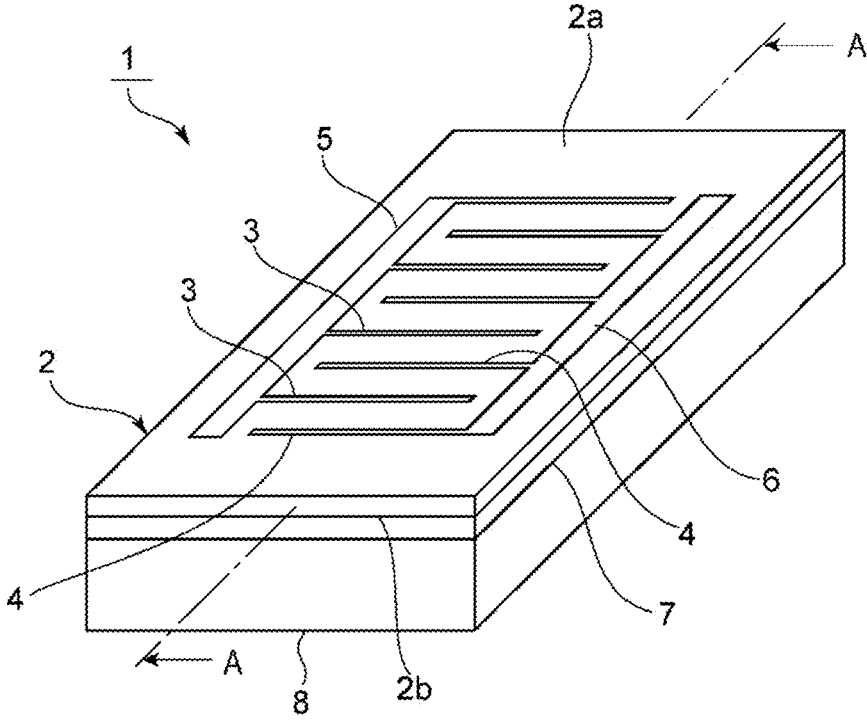
FIG. 26A is a schematic external perspective view of an acoustic wave device that uses a thickness-shear-mode bulk wave.
Figure 26B:
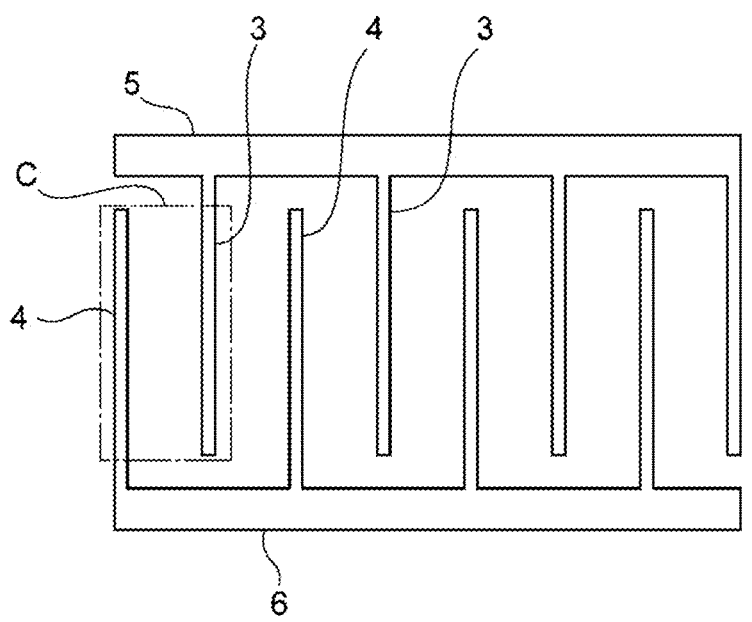
FIG. 26B is a plan view illustrating an electrode structure on a piezoelectric layer.
Figures 27, 28A, 28B:
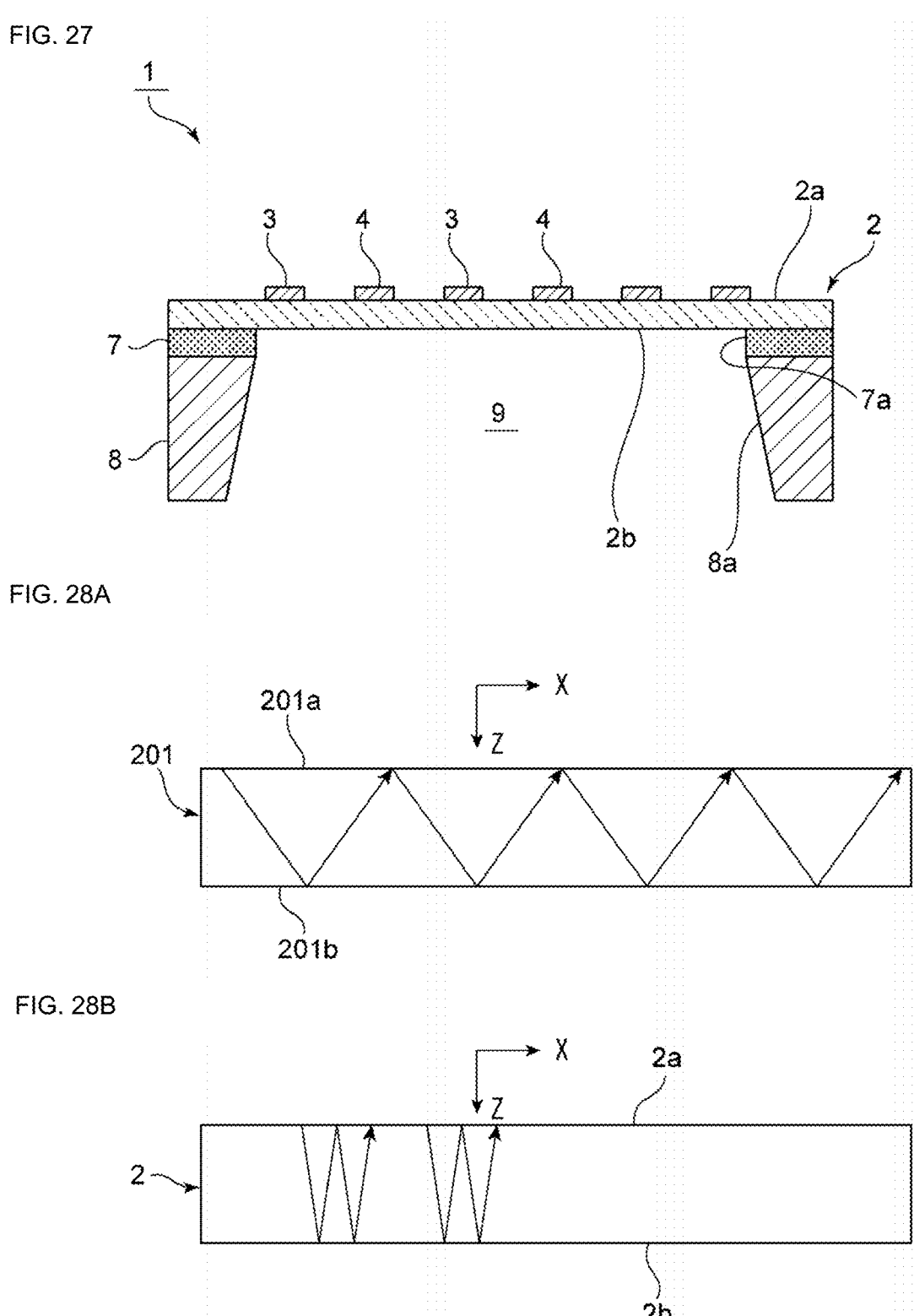
FIG. 27 is a cross-sectional view taken along line A-A in FIG. 26A.
FIG. 28A is a schematic elevational cross-sectional view illustrating a Lamb wave that propagates in a piezoelectric film of an acoustic wave device.
FIG. 28B is a schematic elevational cross-sectional view illustrating a thickness-shear-mode bulk wave that propagates in a piezoelectric film of an acoustic wave device.

FIG. 26A is a schematic external perspective view of an acoustic wave device that uses a thickness-shear-mode bulk wave, FIG. 26B is a plan view illustrating an electrode structure on a piezoelectric layer, and FIG. 27 is a cross-sectional view taken along line A-A in FIG. 26A.

An acoustic wave device 1 includes a piezoelectric layer 2 made of LiNbO$_3$. The piezoelectric layer 2 may be made of LiTaO$_3$. Although the cut angle of LiNbO$_3$ and LiTaO$_3$ is Z-cut, the cut angle may be rotational Y-cut or X-cut. Although the thickness of the piezoelectric layer 2 is not particularly limited, in order to effectively excite a thickness shear mode, it is preferable that the thickness be greater than or equal to about 40 nm and less than or equal to about 1000 nm, and it is more preferable that the thickness be greater than or equal to about 50 nm and less than or equal to about 1000 nm, for example. The piezoelectric layer 2 has first and second main surfaces 2a and 2b that face each other. An electrode 3 and an electrode 4 are provided on the first main surface 2a. Here, the electrode 3 is an example of a "first electrode", and the electrode 4 is an example of a "second electrode". In FIGS. 26A and 26B, a plurality of electrodes 3 are a plurality of first electrode fingers that are connected to a first busbar 5. A plurality of electrodes 4 are a plurality of second electrode fingers that are connected to a second busbar 6. The plurality of electrodes 3 and the plurality of electrodes 4 interdigitate with each other. The electrodes 3 and the electrodes 4 each have a rectangular shape and a length direction. Each of the electrodes 3 and an adjacent one of the electrodes 4 face each other in a direction perpendicular to the length direction. The length direction of the electrodes 3 and 4 and the direction perpendicular to the length direction of the electrodes 3 and 4 are each a direction that crosses the thickness direction of the piezoelectric layer 2. Therefore, it can be said that the electrode 3 and the adjacent electrode 4 face each other in a direction that crosses the thickness direction of the piezoelectric layer 2. The length direction of the electrodes 3 and 4 may be interchanged with a direction perpendicular to the length direction of the electrodes 3 and 4 illustrated in FIGS. 26A and 26B. That is, the electrodes 3 and 4 may be extended in a direction in which the first busbar 5 and the second busbar 6 extend in FIGS. 26A and 26B. In this case, the first busbar 5 and the second busbar 6 extend in a direction in which the electrodes 3 and 4 extend in FIGS. 26A and 26B. A plurality of pairs of structures in each of which the electrode 3 connected to one potential and the electrode 4 connected to the other potential are adjacent to each other are provided in the direction perpendicular to the length direction of the electrodes 3 and 4. Here, "the electrode 3 and the electrode 4 are adjacent to each other" does not refer to a case where the electrode 3 and the electrode 4 are disposed in direct contact with each other but refers to a case where the electrode 3 and the electrode 4 are disposed with a space therebetween. In the case where the electrode 3 and the electrode 4 are adjacent to each other, an electrode connected to a hot electrode or a ground electrode, including other electrodes 3 and 4, is not disposed between the electrode 3 and the electrode 4. The number of pairs need not be an integer, and may be 1.5 pairs, 2.5 pairs, or the like. It is preferable that the center-to-center distance between the electrodes 3 and 4, that is, the pitch be in the range of greater than or equal to about 1 μm and less than or equal to about 10 μm, for example. It is preferable that the width of the electrodes 3 and 4, that is, the dimension of the electrodes 3 and 4 in the facing direction be in the range of greater than or equal to about 50 nm and less than or equal to about 1000 nm, and it is more preferable that the width be in the range of greater than or equal to about 150 nm and less than or equal to about 1000 nm, for example. The "center-to-center distance between the electrodes 3 and 4" is the distance between the center of the dimension (width dimension) of the electrode 3 in the direction perpendicular to the length direction of the electrode 3 and the center of the dimension (width dimension) of the electrode 4 in the direction perpendicular to the length direction of the electrode 4.

Since a Z-cut piezoelectric layer is used in the acoustic wave device 1, the direction perpendicular to the length direction of the electrodes 3 and 4 is the direction perpendicular to the polarization direction of the piezoelectric layer 2. This does not apply to a case where a piezoelectric body having another cut angle is used in the piezoelectric layer 2. Here, "perpendicular" is not limited to a case of being strictly perpendicular, and may be substantially perpendicular (such that the angle between the direction that is perpendicular to the length direction of the electrodes 3 and 4 and the polarization direction is in the range of, for example, about 90°±10°).

A support 8 is stacked on the second main surface 2b side of the piezoelectric layer 2 with an insulating layer 7 therebetween. The insulating layer 7 and the support 8 have frame-like shapes and have through-holes 7a and 8a as illustrated in FIG. 27. Thus, a cavity portion 9 is provided. The cavity portion 9 is provided in order not to hinder the vibration of an excitation region C of the piezoelectric layer 2. Accordingly, the support 8 is stacked on the second main surface 2b with the insulating layer 7 therebetween at a position that does not overlap a portion where at least one pair of electrodes 3 and 4 are provided. The insulating layer 7 need not be provided. Accordingly, the support 8 can be directly or indirectly stacked on the second main surface 2b of the piezoelectric layer 2.

The insulating layer 7 is made of silicon oxide. However, instead of silicon oxide, it is possible to use any appropriate insulating material such as silicon oxynitride, alumina, or the like. The support 8 is made of Si. The plane orientation of Si on the piezoelectric layer 2 side may be (100), (110), or (111). It is desirable that Si that forms of the support 8 have a high resistivity that is higher than or equal to about 4 kΩ·cm, for example. However, the support 8 may also be made of any appropriate insulating material or semiconductor material.

As the material of the support 8, it is possible to use, for example, any of the following: a piezoelectric material such as aluminum oxide, lithium tantalate, lithium niobate, or quartz; ceramics such as alumina, magnesia, sapphire, silicon nitride, aluminum nitride, silicon carbide, zirconia, cordierite, mullite, steatite, or forsterite; a dielectric such as diamond or glass; a semiconductor such as gallium nitride; or the like.

The plurality of electrodes 3 and 4 and the first and second busbars 5 and 6 are each made of an appropriate metal or alloy such as Al, an AlCu alloy, or the like. In the present example embodiment, the electrodes 3 and 4 and the first and second busbars 5 and 6 each have a structure in which an Al film is stacked on a Ti film. A close-contact layer other than a Ti film may be used.

To drive the acoustic wave device, an alternative-current voltage is applied between the plurality of electrodes 3 and the plurality of electrodes 4. To be more specific, an alternative-current voltage is applied between the first busbar 5 and the second busbar 6. Thus, it is possible to obtain resonance characteristics using a thickness-shear-mode bulk wave excited in the piezoelectric layer 2. Moreover, in the acoustic wave device 1, d/p is less than or equal to about 0.5, for example, where d is the thickness of the piezoelectric layer 2 and p is the center-to-center distance between adjacent electrodes 3 and 4 among the plurality of pairs of electrodes 3 and 4. Therefore, the thickness-shear-mode bulk wave is effectively excited and it is possible to obtain good resonance characteristics. More preferably, d/p is less than equal to about 0.24, for example, and, in this case, it is possible to obtain better resonance characteristics.

With the acoustic wave device 1, due to the above configuration, decrease of the Q-value does not easily occur even when the number of pairs of the electrodes 3 and 4 is reduced to achieve reduction in size. This is because propagation loss is small even when the number of electrode fingers in reflectors on both sides is reduced. Moreover, the number of the electrode fingers can be reduced because a thickness-shear-mode bulk wave is used. Referring to FIGS. 28A and 28B, the difference between a Lamb wave used in an acoustic wave device and the thickness-shear-mode bulk wave will be described.

FIG. 28A is a schematic elevational cross-sectional view illustrating a Lamb wave that propagates in a piezoelectric film of an acoustic wave device, such as the one described in Japanese Unexamined Patent Application Publication No. 2012-257019. Here, the wave propagates in a piezoelectric film 201 as indicated by arrows. Here, in the piezoelectric film 201, a first main surface 201a and a second main surface 201b face each other, and the thickness direction connecting the first main surface 201a and the second main surface 201b is the Z direction. The X direction is the direction in which electrode fingers of an IDT electrode are arranged. As illustrated in FIG. 28A, the Lamb wave propagates in the X direction. Although the piezoelectric film 201 vibrates as its entirety since the Lamb wave is a plate wave, resonance characteristics are obtained by disposing reflectors on both sides, since the wave propagates in the X direction. Therefore, wave propagation loss occurs, and the Q-value decreases when reduction in size is intended, that is, the number of pairs of electrode fingers is reduced.

In contrast, as illustrated in FIG. 28B, in the acoustic wave device 1, since vibrational displacement is in the thickness-shear direction, a wave propagates substantially in a direction connecting the first main surface 2a and the second main surface 2b of the piezoelectric layer 2, that is, the Z direction, and resonates. That is, the X-direction component of the wave is considerably small compared with the Z-direction component. Since resonance characteristics are obtained due to the propagation of the wave in the Z direction, even when the number of electrode fingers of the reflector is reduced, propagation loss does not easily occur. Moreover, even when the number of pairs the electrodes 3 and 4 is reduced to promote reduction in size, decrease of the Q-value does not easily occur.

Figure 29:
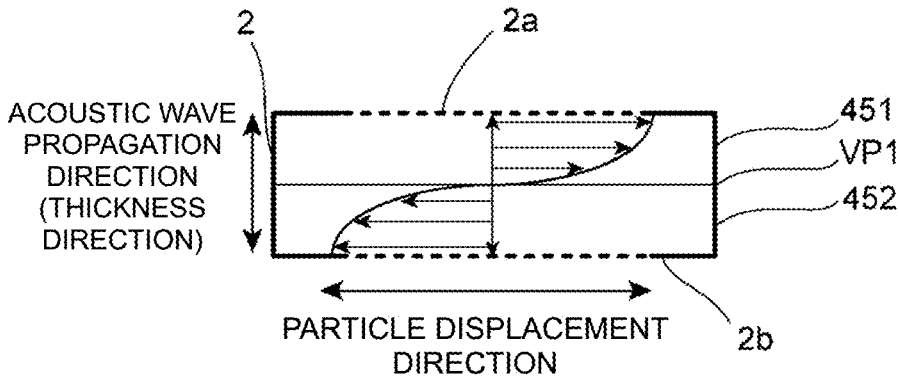
FIG. 29 illustrates the amplitude direction of a thickness-shear-mode bulk wave.

As illustrated in FIG. 29, the amplitude direction of a thickness-shear-mode bulk wave in a first region 451 included in the excitation region C of the piezoelectric layer 2 is opposite to that in a second region 452 included in the excitation region C. FIG. 29 schematically illustrates a bulk wave when a voltage such that the potential of the electrode 4 is higher than that of the electrode 3 is applied between electrode 3 and the electrode 4. The first region 451 is a region that is included in the excitation region C and located between the first main surface 2a and a virtual plane VP1 that is perpendicular to the thickness direction of the piezoelectric layer 2 and bisects the piezoelectric layer 2. The second region 452 is a region that is included in the excitation region C and located between the second main surface 2b and the virtual plane VP1.

As described above, in the acoustic wave device 1, at least one pair of electrodes including the electrode 3 and the electrode 4 are provided. However, since a wave need not propagate in the X direction, the number of pairs of the electrodes 3 and 4 need not be plural. That is, it is sufficient that at least one pair of electrodes be provided.

For example, the electrode 3 is an electrode connected to a hot potential, and the electrode 4 is an electrode connected to a ground potential. However, the electrode 3 may be connected to the ground potential, and the electrode 4 may be connected to the hot potential. In the present example embodiment, as described above, at least one pair of electrodes are an electrode connected to the hot potential or an electrode connected to the ground potential, and a floating electrode is not provided.

Figure 30:
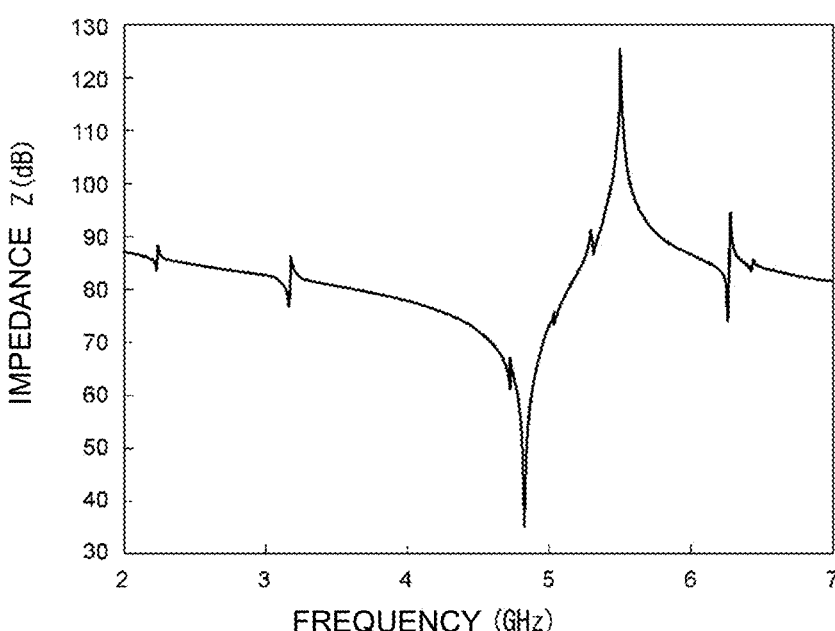
FIG. 30 is a graph illustrating the resonance characteristics of an acoustic wave device that uses a thickness-shear-mode bulk wave.

FIG. 30 is a graph illustrating the resonance characteristics of the acoustic wave device illustrated in FIG. 27. The design parameters of the acoustic wave device 1 having the resonance characteristics are as follows.

piezoelectric layer 2: $LiNbO_3$ having Euler angles (0°, 0°, 90°), thickness=400 nm the length of a region in which the electrode 3 and the electrode 4 overlap when seen in the direction perpendicular to the length direction of the electrode 3 and the electrode 4, that is, the length of the excitation region C=40 μm, the number of pairs of electrodes composed of the electrodes 3 and 4=21 pairs, the center-to-center distance between the electrodes=3 μm, the width of the electrodes 3 and 4=500 nm, d/p=0.133 insulating layer 7: a silicon oxide film having a thickness of 1 μm support 8: Si The "length of the excitation region C" is the dimension of the excitation region C in the length direction of the electrodes 3 and 4.

In the present example embodiment, the electrode-to-electrode distance of an electrode pair composed of the electrodes 3 and 4 is equalized in all pairs. That is, the electrodes 3 and the electrodes 4 are arranged at a regular pitch.

As can be clearly seen from FIG. 30, even without a reflector, good resonance characteristics having a fractional bandwidth of about 12.5% are obtained, for example.

Figure 31:
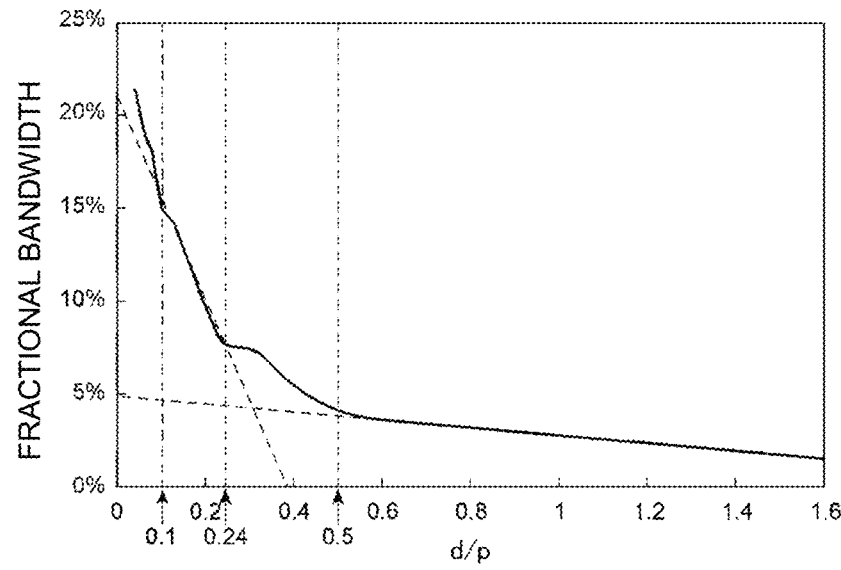
FIG. 31 is a graph illustrating the relationship between d/p and the fractional bandwidth as a resonator, where p is the center-to-center distance between adjacent electrodes and d is the thickness of a piezoelectric layer.

As described above, in the present example embodiment, d/p is less than or equal to about 0.5 and more preferably less than or equal to about 0.24, for example, where d is the thickness of the piezoelectric layer 2 and p is the center-to-center distance between the electrode 3 and the electrode 4. Referring to FIG. 31, this will be described.

A plurality of acoustic wave devices similar to the acoustic wave device having the resonance characteristics illustrated in FIG. 30 are obtained, except that d/p is changed. FIG. 31 is a graph illustrating the relationship between d/p and the fractional bandwidth of an acoustic wave device as a resonator.

As can be clearly seen from FIG. 31, when d/p>about 0.5, even if d/p is adjusted, the fractional bandwidth is less than about 5%, for example. In contrast, when d/p≥about 0.5, by changing d/p in this range, it is possible to make the fractional bandwidth greater than or equal to about 58, for example, that is, it is possible to configure a resonator having a high coupling coefficient. Moreover, when d/p is less than or equal to about 0.24, it is possible to increase the fractional bandwidth to greater than or equal to about 78, for example. In addition, by adjusting d/p in this range, it is possible to obtain a resonator having a wider fractional bandwidth and it is possible to realize a resonator having a higher coupling coefficient. Accordingly, it can be seen that, by making d/p less than or equal to about 0.5, for example, it is possible to configure a resonator that uses a thickness-shear-mode bulk wave and has a high coupling coefficient.

Figure 32:
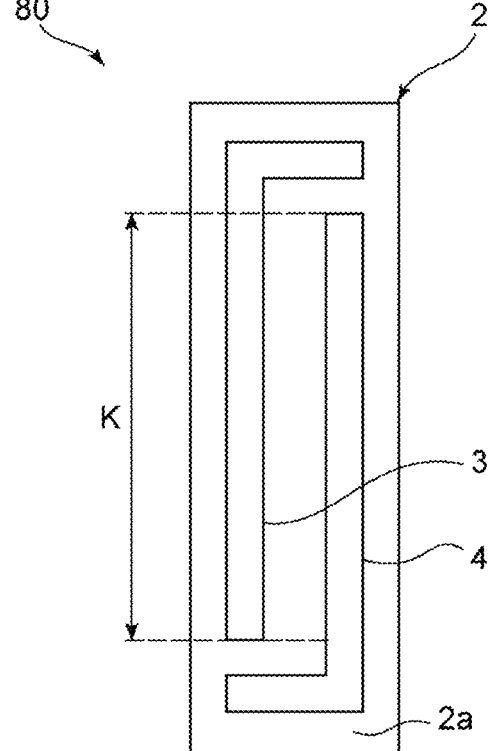
FIG. 32 is a plan view of an acoustic wave device that uses a thickness-shear-mode bulk wave.

FIG. 32 is a plan view of an acoustic wave device that uses a thickness-shear-mode bulk wave. In an acoustic wave device 80, a pair of electrodes including the electrode 3 and the electrode 4 are provided on the first main surface 2a of the piezoelectric layer 2. K in FIG. 32 is the crossing width. As described above, in an acoustic wave device according to an example embodiment of the present invention, the number of pairs of electrodes may be one pair. Also in this case, when d/p is less than or equal to about 0.5, for example, it is possible to effectively excite a thickness-shear-mode bulk wave.

Figure 33:
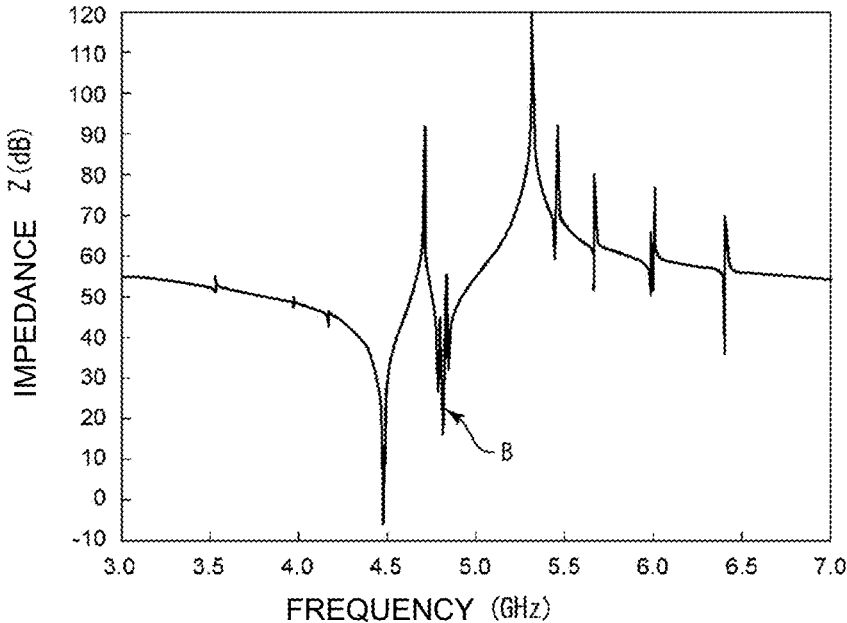
FIG. 33 is a graph illustrating the resonance characteristics of an acoustic wave device according to a reference example in which a spurious response is generated.
Figure 34:
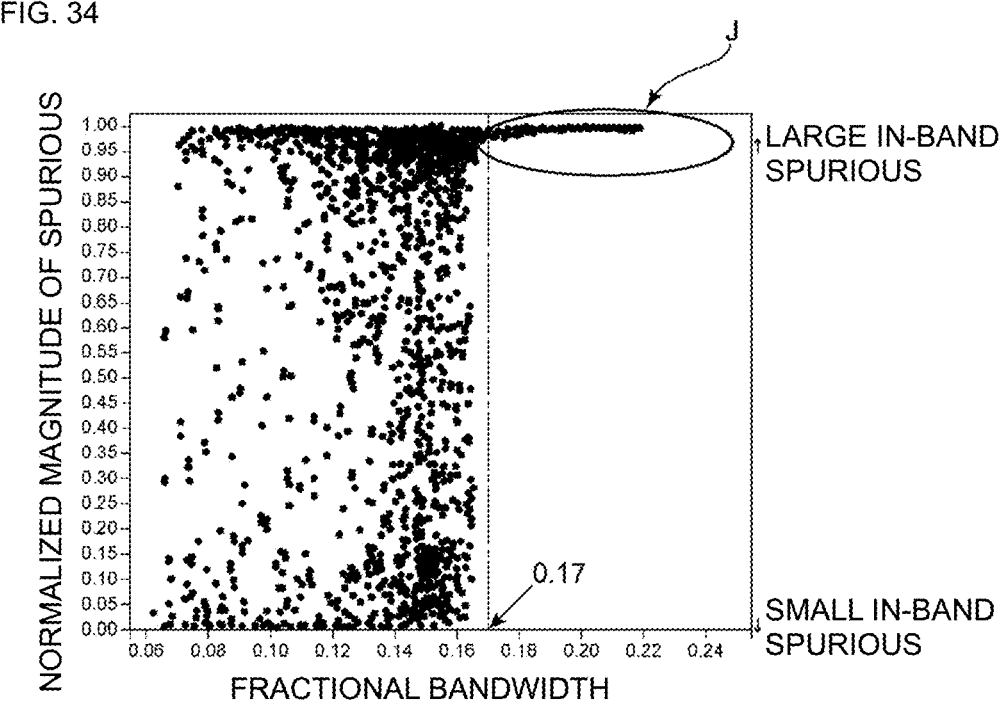
FIG. 34 is a graph illustrating the relationship between the fractional bandwidth and the phase rotation amount of the impedance of spurious normalized with 180 degrees as the magnitude of spurious.

In the acoustic wave device 1, preferably, it is desirable that MR≤about 1.75 (d/p)+0.075 be satisfied, where MR is the metallization ratio of the adjacent electrodes 3 and 4, among the plurality of electrodes 3 and 4, with respect to the excitation region C, which is a region that the adjacent electrodes 3 and 4 overlap when seen in a direction in which the adjacent electrodes 3 and 4 face each other. In this case, it is possible to effectively reduce spurious. Referring to FIGS. 33 and 34, this will be described. FIG. 33 is a reference graph illustrating an example of the resonance characteristics of the acoustic wave device 1. A spurious indicated by an arrow B is generated between a resonant frequency and an anti-resonant frequency. d/p=about 0.08, and Euler angles of LiNbO$_3$ are (0°, 0°, 90°), for example. The metallization ratio MR=about 0.35, for example.

Referring to FIG. 26B, the metallization ratio MR will be described. It is supposed that, when one pair of electrodes 3 and 4 are focused, only this pair of electrodes 3 and 4 are provided in the electrode structure illustrated in FIG. 26B. In this case, a portion surrounded by an alternate long and short dash line is the excitation region C. This "excitation region C" is: a region of the electrode 3 that overlaps the electrode 4 when the electrode 3 and the electrode 4 are seen in the direction perpendicular to the length direction of the electrodes 3 and 4, that is, the facing direction; a region of the electrode 4 that overlaps the electrode 3; and a region that is located between the electrode 3 and the electrode 4 and where the electrode 3 and the electrode 4 overlap each other. Then, the metallization ratio MR is the ratio of the area of the excitation region C to the area of the electrodes 3 and 4 in the excitation region C. That is, the metallization ratio MR is the ratio of the area of a metallization portion to the area of the excitation region C.

When a plurality of pairs of electrodes are provided, MR may be defined as the ratio of metallization portions included in all excitation regions to the sum of the areas of the excitation regions.

FIG. 34 is a graph illustrating the relationship between the fractional bandwidth and the phase rotation amount of the impedance of spurious normalized with 180 degrees as the magnitude of spurious, when a large number of acoustic wave resonators are configured in accordance with the present example embodiment. The fractional bandwidth is adjusted by changing the film thickness of the piezoelectric layer and the dimensions of electrodes in various ways. Although the results shown in FIG. 34 are those when a piezoelectric layer made of Z-cut LiNbO$_3$ is used, similar results are obtained when a piezoelectric layer having another cut angle is used.

Spurious is as large as about 1.0 in a region surrounded by an ellipse J in FIG. 34. As can be clearly seen from FIG. 34, when the fractional bandwidth exceeds about 0.17, that is, about exceeds 17%, for example, a large spurious of a spurious level of 1 or greater is generated in a pass band, even when parameters of the fractional bandwidth are changed. That is, as in the resonance characteristics illustrated in FIG. 33, a large spurious indicated by the arrow B is generated in the band. Thus, it is preferable that the fractional bandwidth be less than or equal to about 17%, for example. In this case, it is possible to reduce spurious by adjusting the film thickness of the piezoelectric layer 2, the dimensions of the electrodes 3 and 4, and the like.

Figure 35:
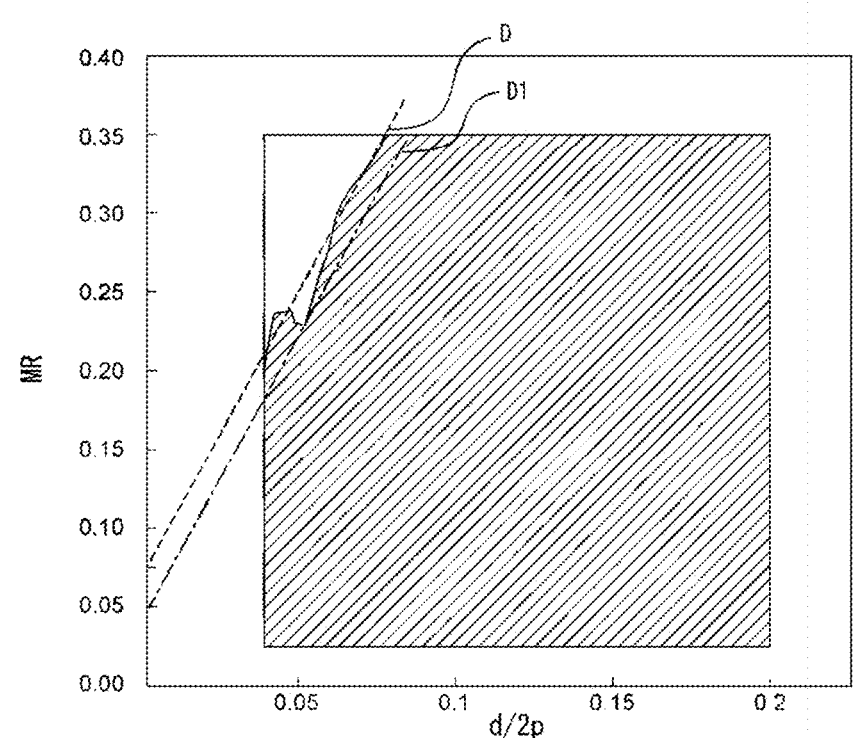
FIG. 35 is a graph illustrating the relationship between d/2p and the metallization ratio MR.

FIG. 35 is a graph illustrating the relationship among d/2p, the metallization ratio MR, and the fractional bandwidth. Regarding the acoustic wave device described above, various acoustic wave devices that differ in d/2p and MR are configured, and the fractional bandwidth is measured. The hatched region in FIG. 35 on the right side of a broken line D is a region in which the fractional bandwidth is less than or equal to about 178, for example. The boundary between the hatched region and the unhatched region is represented by MR=about 3.5 (d/2p)+0.075, for example. That is, MR=about 1.75 (d/p)+0.075, for example. Accordingly, preferably, MR≤about 1.75 (d/p)+0.075, for example. In this case, it is easy to make the fractional bandwidth less than or equal to about 178, for example. A region on the right side of MR=about 3.5 (d/2p)+0.05, which is represented by an alternate long and short dash line D1 in FIG. 35, is more preferable, for example. That is, when MR≤about 1.75 (d/p)+0.05, it is possible to reliably make the fractional bandwidth less than or equal to about 17%, for example.

Figure 36:
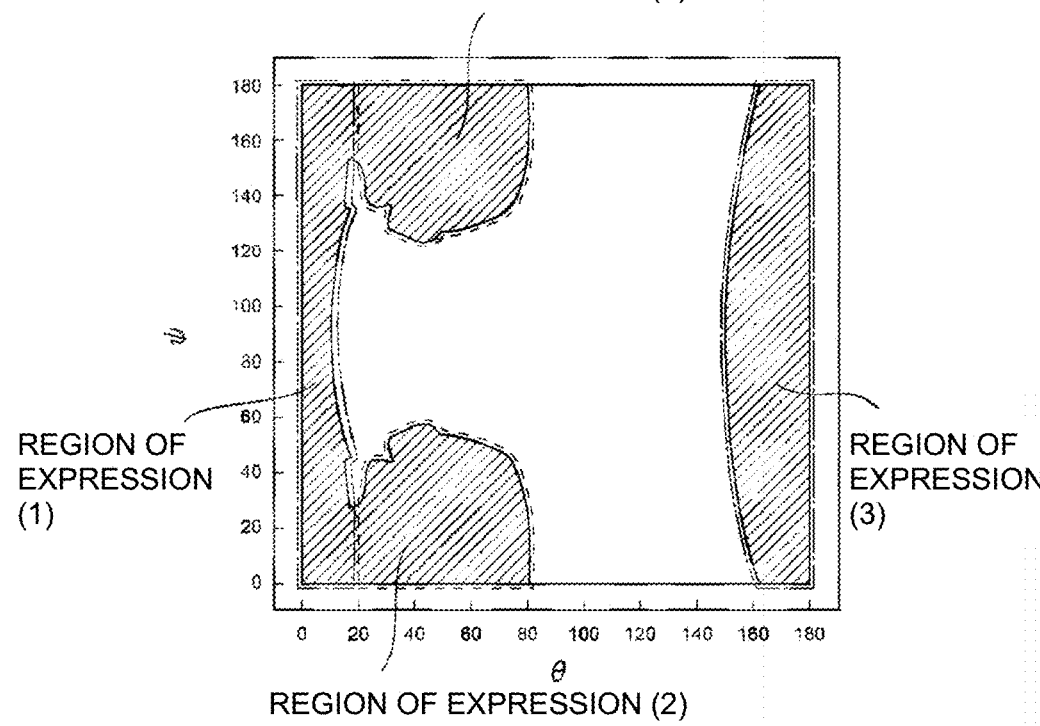
FIG. 36 illustrates a map of the fractional bandwidth with respect to the Euler angles $(0°, \theta, \psi)$ of $LiNbO_3$ when d/p is infinitely close to 0.

FIG. 36 illustrates a map of the fractional bandwidth with respect to the Euler angles (0°, θ, ψ) of LiNbO$_3$ when d/p is made infinitely close to 0. The hatched portion in FIG. 36 is a region in which a fractional bandwidth of at least about 5% or greater is obtained, for example, and the range of the region is approximately a range represented by the following expressions (1), (2), and (3).

$$(0° \pm 10°, 0° \text{ to } 20°, \text{any } \psi) \qquad \text{expression (1)}$$

$$\left(0° \pm 10°, 20° \text{ to } 80°, 0° \text{ to } 60°\left(1 - (\theta - 50)^2/900\right)^{1/2}\right) \qquad \text{expression (2)}$$

$$\text{or } \left(0° \pm 10°, \right.$$

$$20° \text{ to } 80°, \left[180° - 60°\left(1 - (\theta - 50)^2/900\right)^{1/2}\right] \text{ to } 180°\right)$$

$$\left(0° \pm 10°, \left[180° - 30°\left(1 - (\psi - 90)^2/8100\right)^{1/2}\right] \text{ to } 180°, \right. \qquad \text{expression (3)}$$

$$\left. \text{any } \psi\right)$$

Accordingly, the Euler angle range of the expressions (1), (2), or (3), with which the fractional bandwidth can be made sufficiently wide, is preferable. The same applies to a case where the piezoelectric layer 2 is a lithium tantalate layer.

Figure 37:
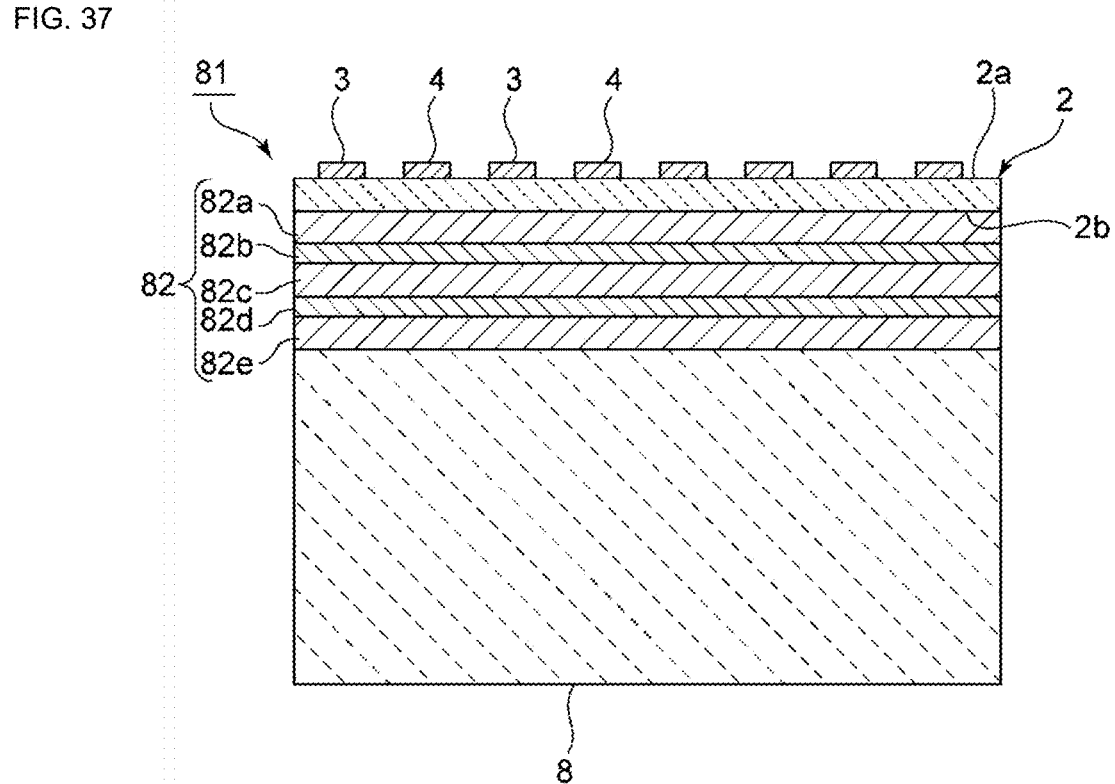
FIG. 37 is an elevational cross-sectional view of an acoustic wave device including an acoustic multilayer film.

FIG. 37 is an elevational cross-sectional view of an acoustic wave device including an acoustic multilayer film.

In an acoustic wave device 81, an acoustic multilayer film 82 is stacked on the second main surface 2b of the piezoelectric layer 2. The acoustic multilayer film 82 has a stacked structure including: low-acoustic-impedance layers 82a, 82c, and 82e whose acoustic impedance is relatively low; and high-acoustic-impedance layers 82b and 82d whose acoustic impedance is relatively high. When the acoustic multilayer film 82 is used, without using the cavity portion 9 in the acoustic wave device 1, it is possible to confine a thickness-shear-mode bulk wave in the piezoelectric layer 2. Also with the acoustic wave device 81, by making d/p less than or equal to about 0.5, for example, it is possible to obtain resonance characteristics based on a thickness-shear-mode bulk wave. In the acoustic multilayer film 82, the number of the low-acoustic-impedance layers 82a, 82c, and 82e and the number of the high-acoustic-impedance layers 82b and 82d are not particularly limited. It is only necessary that at least one of the high-acoustic-impedance layers 82b and 82d be disposed on a side farther from the piezoelectric layer 2 than the low-acoustic-impedance layers 82a, 82c, and 82e.

The low-acoustic-impedance layers 82a, 82c, and 82e and the high-acoustic-impedance layers 82b and 82d may be made of any appropriate materials, as long as the aforementioned relationship of the acoustic impedance are satisfied. Examples of the material of the low-acoustic-impedance layers 82a, 82c, and 82e include silicon oxide and silicon oxynitride. Examples of the material of the high-acoustic-impedance layers 82b and 82d include alumina, silicon nitride, and a metal.

In the acoustic wave devices according to the first to fourth example embodiments and the modifications, for example, between the support and the piezoelectric layer, the acoustic multilayer film 82 illustrated in FIG. 37 may be provided as an acoustic reflective film. To be specific, the support and the piezoelectric layer may be disposed so that at least a portion of the support and at least a portion of the piezoelectric layer face each other with the acoustic multilayer film 82 therebetween. In this case, it is sufficient that a low-acoustic-impedance layer and a high-acoustic-impedance layer be alternately stacked in the acoustic multilayer film 82. The acoustic multilayer film 82 may be an acoustic reflector in the acoustic wave device.

As described above, in the acoustic wave devices according to the first to fourth example embodiments and the modifications, each of which uses a thickness-shear-mode bulk wave, it is preferable that d/p be less than or equal to about 0.5, and it is more preferable that d/p be less than or equal to about 0.24, for example. Thus, it is possible to obtain better resonance characteristics. Moreover, as described above, in the excitation region of the acoustic wave devices according to the first to fourth example embodiments and the modifications, each of which uses a thickness-shear-mode bulk wave, it is preferable that MR≤about 1.75 (d/p)+0.075 be satisfied, for example. In this case, it is possible to more reliably suppress spurious.

It is preferable that the piezoelectric layer in the acoustic wave devices according to the first to fourth example embodiments and the modifications, each of which uses a thickness-shear-mode bulk wave, be a lithium niobate layer or a lithium tantalate layer. It is preferable that the Euler angles (φ, θ, ψ) of lithium niobate or lithium tantalate of the piezoelectric layer be in the range of the above expression (1), (2), or (3). In this case, it is possible to make the fractional bandwidth sufficiently wide.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:

a support including a support substrate;

a piezoelectric layer that is provided on the support, is made of lithium niobate or lithium tantalate, and includes a first main surface and a second main surface that face each other;

an IDT electrode that is provided on the first main surface of the piezoelectric layer and includes a pair of busbars and a plurality of electrode fingers; and at least one mass-adding film that is provided on the piezoelectric layer; wherein in plan view as seen in a stacking direction in which the support and the piezoelectric layer are stacked, an acoustic reflector is provided at a position that overlaps at least a portion of the IDT electrode;

d/p is less than or equal to about 0.5, where d is a thickness of the piezoelectric layer and p is a center-to-center distance between the electrode fingers that are adjacent to each other;

some electric fingers among the plurality of electrode fingers are connected to one of the busbars of the IDT electrode, remaining electrode fingers among the plurality of electrode fingers are connected to the other busbar, and the plurality of electrode fingers that are connected to the one of the busbars and the plurality of electrode fingers that are connected to the other busbar interdigitate with each other;

when an electrode-finger-facing direction is defined as a direction in which the electrode fingers that are adjacent to each other face each other, a region in which the adjacent electrode fingers overlap each other when seen from the electrode-finger-facing direction is a crossing region, and regions that are located between the crossing region and the pair of busbars are a pair of gap regions; and at least one of the mass-adding film overlaps at least one of the gap region in plan view, does not overlap at least a portion of the pair of busbars in plan view, and is provided on the second main surface of the piezoelectric layer.

2. The acoustic wave device according to claim 1, wherein when an electrode-finger-extending direction is defined as a direction in which the plurality of electrode fingers extend, the crossing region includes a central region and a pair of edge regions positioned with the central region therebetween in the electrode-finger-extending direction;

the at least one mass-adding film includes at least one first mass-adding film that is provided on the second main surface of the piezoelectric layer and at least one second mass-adding film;

the first mass-adding film overlaps the gap region in plan view; and the second mass-adding film overlaps, in plan view, the edge region that is adjacent to the gap region that the first mass-adding film overlaps in plan view.

3. The acoustic wave device according to claim 2, wherein, in plan view, the second mass-adding film is continuously provided in a region that overlaps the plurality of electrode fingers and a region that overlaps a portion between the electrode fingers.

4. The acoustic wave device according to claim 2, wherein a thickness the first mass-adding film and a thickness the second mass-adding are the same.

5. The acoustic wave device according to claim 2, wherein a thickness the first mass-adding film and a thickness the second mass-adding differ from each other.

6. The acoustic wave device according to claim 2, wherein a material of the first mass-adding film and a material of the second mass-adding film are the same.

7. The acoustic wave device according to claim 2, wherein a material of the first mass-adding film and a material of the second mass-adding film differ from each other.

8. The acoustic wave device according to claim 1, wherein the at least one mass-adding film includes at least one first mass-adding film that is provided on the second main surface of the piezoelectric layer and at least one third mass-adding film;

the first mass-adding film overlaps the gap region in plan view; and the third mass-adding film overlaps, in plan view, the busbar that is adjacent to the gap region that the first mass-adding film overlaps in plan view.

9. The acoustic wave device according to claim 1, wherein the at least one mass-adding film includes at least one first mass-adding film that is provided on the second main surface of the piezoelectric layer and at least one fourth mass-adding film that is provided on the first main surface; and the first mass-adding film and the fourth mass-adding film overlap the gap region in plan view.

10. The acoustic wave device according to claim 9, wherein a material of the first mass-adding film and a material of the fourth mass-adding film are the same.

11. The acoustic wave device according to claim 9, wherein a material the first mass-adding film and a material of the fourth mass-adding film differ from each other.

12. The acoustic wave device according to claim 9, wherein, when an electrode-finger-extending direction is defined as a direction in which the plurality of electrode fingers extend, a dimension of the first mass-adding film in the electrode-finger-extending direction and a dimension of the fourth mass-adding film in the electrode-finger-extending direction differ from each other.

13. The acoustic wave device according to claim 9, wherein when an electrode-finger-extending direction is defined as a direction in which the plurality of electrode fingers extend, the crossing region includes a central region and a pair of edge regions positioned with the central region therebetween in the electrode-finger-extending direction;

the at least one mass-adding film further includes at least one fifth mass-adding film that is provided on the first main surface of the piezoelectric layer; and the fifth mass-adding film overlaps, in plan view, the edge region that is adjacent to the gap region that the fourth mass-adding film overlaps in plan view.

14. The acoustic wave device according to claim 13, wherein a material of the fourth mass-adding film and a material of the fifth mass-adding film are the same.

15. The acoustic wave device according to claim 13, wherein a material of the fourth mass-adding film and a material of the fifth mass-adding film differ from each other.

16. The acoustic wave device according to claim 1, wherein at least one dielectric selected from the group consisting of silicon oxide, tungsten oxide, niobium oxide, tantalum oxide, and hafnium oxide is included in the at least one mass-adding film.

17. The acoustic wave device according to claim 1, further comprising a dielectric film that is provided on the first main surface of the piezoelectric layer so as to cover the IDT electrode.

18. The acoustic wave device according to claim 1, wherein the acoustic reflector is a cavity portion, and the support and the piezoelectric layer are positioned so that a portion of the support and a portion of the piezoelectric layer face each other with the cavity portion therebetween.

19. The acoustic wave device according to claim 1, wherein the acoustic reflector includes an acoustic reflective film that includes a high-acoustic-impedance layer whose acoustic impedance is relatively high and a low-acoustic-impedance layer whose acoustic impedance is relatively low, and the support and the piezoelectric layer are positioned so that at least a portion of the support and at least a portion of the piezoelectric layer face each other with the acoustic reflective film therebetween.

20. The acoustic wave device according to claim 1, wherein d/p is less than or equal to about 0.24.

21. The acoustic wave device according to claim 1, wherein MR≤about 1.75(d/p)+0.075 is satisfied, where MR is a metallization ratio of the plurality of electrode fingers with respect to an excitation region that is a region where the adjacent electrode fingers overlap each other when seen from the electrode-finger-facing direction and that is between centers of the adjacent electrode fingers.

22. The acoustic wave device according to claim 1, wherein Euler angles ($\varphi$, $\theta$, $\psi$) of lithium niobate or lithium tantalate included in the piezoelectric layer are in a range of expressions (1), (2), or (3):

$$(0° \pm 10°, 0° \text{ to } 20°, \text{any } \psi) \quad \text{expression (1)}$$

$$(0° \pm 10°, 20° \text{ to } 80°, 0° \text{ to } 60°(1-(\theta-50)^2/900)^{1/2}) \quad \text{expression (2)}$$

$$\text{or } (0° \pm 10°,$$
$$20° \text{ to } 80°, [180° - 60°(1-(\theta-50)^2/900)^{1/2}] \text{ to } 180°)$$

$$(0° \pm 10°, [180° - 30°(1-(\psi-90)^2/8100)^{1/2}] \text{ to } 180°, \quad \text{expression (3)}$$
$$\text{any } \psi).$$

23. A filter device comprising:
a serial arm resonator; and
a parallel arm resonator; wherein
at least one of the parallel arm resonator is the acoustic wave device according to claim 1; and
when an electrode-finger-extending direction is defined as a direction in which the plurality of electrode fingers extend, a dimension of the gap region of the parallel arm resonator that is the acoustic wave device in the electrode-finger-extending direction is greater than a dimension of the gap region of the serial arm resonator in the electrode-finger-extending direction.

24. A filter device comprising:
a serial arm resonator; and
a parallel arm resonator; wherein
at least one of the parallel arm resonator is a first acoustic wave resonator and at least one of the serial arm resonator is a second acoustic wave resonator, and the first acoustic wave resonator and the second acoustic wave resonator are each the acoustic wave device according to claim 1;

when an electrode-finger-extending direction is defined as a direction in which the plurality of electrode fingers extend, a dimension of the gap region of the first acoustic wave resonator in the electrode-finger-extending direction is greater than a dimension of the gap region of the second acoustic wave resonator in the electrode-finger-extending direction; and a dimension, in the electrode-finger-extending direction, of the mass-adding film that overlaps the gap region of the first acoustic wave resonator in plan view is greater than a dimension, in the electrode-finger-extending direction, of the mass-adding film that overlaps the gap region of the second acoustic wave resonator in plan view.

\* \* \* \* \*